(12) United States Patent
Lee

(10) Patent No.: US 11,145,708 B2
(45) Date of Patent: Oct. 12, 2021

(54) DISPLAY DEVICE

(71) Applicant: Samsung Display Co., Ltd., Yongin-si (KR)

(72) Inventor: Won Se Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/032,596

(22) Filed: Sep. 25, 2020

(65) Prior Publication Data
US 2021/0028269 A1   Jan. 28, 2021

Related U.S. Application Data

(63) Continuation of application No. 15/964,411, filed on Apr. 27, 2018, now Pat. No. 10,790,348.

(30) Foreign Application Priority Data

Aug. 29, 2017 (KR) .......................... 10-2017-0109554

(51) Int. Cl.
*H01L 27/32* (2006.01)
*H01L 51/50* (2006.01)
(Continued)

(52) U.S. Cl.
CPC ...... *H01L 27/3276* (2013.01); *H01L 51/5056* (2013.01); *H01L 51/5218* (2013.01); *H01L 51/5234* (2013.01); *G09G 3/3208* (2013.01)

(58) Field of Classification Search
CPC .. G09G 3/3258; G09G 3/3275; G09G 3/3688; G09G 2330/021; G09G 2310/0289; G09G 2300/0408
See application file for complete search history.

(56) References Cited

U.S. PATENT DOCUMENTS 7,599,039 B2    10/2009  Yasuda et al.
9,472,507 B2 *  10/2016  Kwak ................... H01L 23/562
(Continued)

FOREIGN PATENT DOCUMENTS

CN       101174036        5/2008
CN       104241295       12/2014
(Continued)

OTHER PUBLICATIONS

European Office Action for European Application No. 17 154 020.6 dated May 23, 2018.
(Continued)

*Primary Examiner* — William Lu
(74) *Attorney, Agent, or Firm* — Kile Park Reed & Houtteman PLLC

(57) ABSTRACT

A display device includes a display region and a non-display region. First lines are between the substrate and the first insulating layer in the non-display region. Second lines are on a first insulating layer in the non-display region and are alternately disposed with the first lines. A second insulating layer is over the second lines and has a surface unevenness formed by the first and second lines. Third lines are over the second insulating layer and intersect the first lines and the second lines. First insulating patterns are on the second insulating layer and serve to planarize the surface unevenness. The first insulating patterns are between at least adjacent third lines in a plan view.

16 Claims, 15 Drawing Sheets

(51) Int. Cl.
*H01L 51/52* (2006.01)
*G09G 3/3208* (2016.01)

(56) References Cited

U.S. PATENT DOCUMENTS

| | | | |
|---|---|---|---|
| 9,564,477 B2 | 2/2017 | Kim | |
| 9,660,011 B2* | 5/2017 | Kim | H01L 27/3276 |
| 9,713,256 B2* | 7/2017 | Jeon | H05K 1/0281 |
| 10,192,896 B2 | 1/2019 | Kim et al. | |
| 10,361,395 B2* | 7/2019 | Kajiyama | H01L 51/5253 |
| 2003/0117536 A1* | 6/2003 | Jeon | G02F 1/136286 349/40 |
| 2007/0114530 A1* | 5/2007 | Kimura | G09G 3/3225 257/59 |
| 2008/0023837 A1* | 1/2008 | Chen | H01L 21/76802 257/758 |
| 2008/0180627 A1* | 7/2008 | Yasuda | G02F 1/13452 349/152 |
| 2008/0204618 A1* | 8/2008 | Jung | G02F 1/13452 349/40 |
| 2008/0230767 A1* | 9/2008 | Jung | H01L 27/1248 257/40 |
| 2008/0265253 A1* | 10/2008 | Tian | G09G 3/3648 257/59 |
| 2010/0149473 A1* | 6/2010 | Guo | G02F 1/1345 349/122 |
| 2011/0012203 A1* | 1/2011 | Jeong | H01L 29/41733 257/351 |
| 2013/0043495 A1* | 2/2013 | Ogasawara | G09G 3/3677 257/88 |
| 2013/0293595 A1* | 11/2013 | Kim | G09G 3/3611 345/690 |
| 2014/0145153 A1* | 5/2014 | Kim | H01L 51/5296 257/40 |
| 2014/0239270 A1* | 8/2014 | Ko | H01L 27/3265 257/40 |
| 2014/0306941 A1* | 10/2014 | Kim | H04M 1/0268 345/204 |
| 2014/0353670 A1* | 12/2014 | Youn | H01L 51/0097 257/72 |
| 2014/0361262 A1* | 12/2014 | Kim | H01L 27/3218 257/40 |
| 2014/0374703 A1* | 12/2014 | Jung | H01L 51/0031 257/40 |
| 2016/0155859 A1* | 6/2016 | Kimura | G09G 3/3648 257/43 |
| 2016/0179229 A1* | 6/2016 | Ahn | G06F 3/04164 345/173 |
| 2016/0190166 A1* | 6/2016 | Kim | H01L 27/1255 257/71 |
| 2017/0185190 A1* | 6/2017 | Jung | H01L 27/1225 |
| 2017/0193914 A1* | 7/2017 | Heo | G09G 3/3611 |
| 2017/0301280 A1* | 10/2017 | Ka | G09G 3/3406 |
| 2017/0309651 A1* | 10/2017 | Kim | G02F 1/133305 |
| 2018/0144679 A1* | 5/2018 | Lee | H01L 27/124 |
| 2018/0151650 A1* | 5/2018 | Ha | H01L 27/124 |
| 2018/0226460 A1* | 8/2018 | Zhu | G09G 3/3208 |
| 2018/0240856 A1* | 8/2018 | Kim | H01L 27/3276 |
| 2018/0358572 A1* | 12/2018 | Harada | H01L 51/56 |
| 2019/0067404 A1* | 2/2019 | Lee | H01L 51/5056 |
| 2019/0148413 A1 | 5/2019 | Kim et al. | |

FOREIGN PATENT DOCUMENTS

| | | |
|---|---|---|
| CN | 104241544 | 12/2014 |
| CN | 105448252 | 3/2016 |
| EP | 2 814 074 | 12/2014 |
| EP | 2 816 604 | 12/2014 |
| JP | 7199210 | 8/1995 |
| KR | 20-2008-0003962 | 9/2008 |
| KR | 10-2014-0122960 | 10/2014 |
| KR | 10-2014-0129647 | 11/2014 |

OTHER PUBLICATIONS

USPTO Notice of Allowance was issued from the USPTO dated Sep. 14, 2018 with respect tothe cross-referenced co-pending U.S. Appl. No. 15/293,779, filed Oct. 14,2016.

Chinese Office Action for Chinese Patent No or Patent Application No. 201710102617.8, dated Mar. 4, 2021.

* cited by examiner

DISPLAY DEVICE

CROSS-REFERENCE TO RELATED APPLICATION

This is a continuation application based on currently pending U.S. patent application Ser. No. 15/964,411, filed on Apr. 27, 2018, the disclosure of which is incorporated herein by reference in its entirety. U.S. patent application Ser. No. 15/964,411 claims priority benefit of Korean Patent Application No. 10-2017-0109554, filed on Aug. 29, 2017 in the Korean Intellectual Property Office, the disclosure of which is incorporated herein by reference in its entirety for all purposes.

BACKGROUND

1. Field

One or more embodiments described herein relate to a display device.

2. Description of the Related Art

An organic light emitting display device emits light from pixels that include organic light emitting diodes. Each diode has an organic emitting layer between the two electrodes. Electrons injected from one electrode and holes injected from the other electrode combine in the organic emitting layer to form excitons. Light is emitted when the excitons change state.

SUMMARY

In accordance with one or more embodiments, a display device includes a substrate with a display region to display an image and a non-display region at at least one side of the display region; a plurality of pixels in the display region; a first insulating layer on the substrate; first lines provided between the substrate and the first insulating layer in the non-display region, the first lines extending along the non-display region; second lines on the first insulating layer in the non-display region, the second lines being alternately disposed with the first lines; a second insulating layer over the second lines and having a surface unevenness formed by the first and second lines; third lines over the second insulating layer and intersecting the first lines and the second lines; and first insulating patterns, on the second insulating layer, to planarize the surface unevenness, the first insulating patterns between at least adjacent third lines in a plan view.

At least a portion of the first insulating patterns may be between the first lines and the third lines and between the second lines and the third lines. The first insulating patterns may be connected to each other to form an insulating pattern layer. The third lines may be on the insulating pattern layer. The display device may include a gate driver and an emission driver in the non-display region. The first lines and the second lines may be between the gate driver and emission driver and the display region. The third lines may connect the gate driver to the emission driver.

In accordance with one or more other embodiments, a display device includes a substrate including a display region to display an image and a non-display region at at least one side of the display region; a plurality of pixels in the display region; data connection lines on the substrate of the non-display region and extending along the non-display region, the data connection lines to apply data signals to the pixels; a first insulating layer over the data connection lines and having a surface unevenness formed by the data connection lines; scan connection lines on the first insulating layer on the data connection lines; and first insulating patterns, on the first insulating layer, to planarize the surface unevenness, the first insulating patterns between at least adjacent scan connection lines in a plan view.

At least a portion of the first insulating patterns may be between the data connection lines and the scan connection lines. The data connection lines may include first data connection lines on the substrate; and second data connection lines insulated from the first data connection lines through a second insulating layer between the substrate and the first insulating layer. The display device may include power connection lines between the scan connection lines in the non-display region and intersecting the data connection lines, wherein the power connection lines are to supply a power source to the pixels, and wherein the power connection lines are between the adjacent scan connection lines, include a same material as the scan connection lines, and are on a same layer as the scan connection lines.

In a plan view, the first insulating patterns may be between adjacent lines among the scan connection lines and the power connection lines. The display device may include an emission driver in the non-display region; and emission control connection lines connecting the emission driver to the pixels, wherein the emission control connection lines are between the adjacent scan connection lines, include a same material as the scan connection lines, and are on a same layer as that of the scan connection lines.

In a plan view, the first insulating patterns may be between adjacent lines among the scan connection lines, the power connection lines, and the emission control connection lines. The first insulating patterns may be connected to each other to form a first insulating pattern layer. The scan connection lines, the power connection lines, and the emission control connection lines may be on the first insulating pattern layer.

The display device may include an additional region at one side of the non-display region; a first power line extending from the additional region to the non-display region and connected to the power connection lines to supply a first power source to the pixels; and a second power line extending from the additional region to the non-display region, the second power line to supply a second power source to the pixels, wherein the data connection lines extend to the additional region to intersect the first power line and the second power line.

The voltage of the first power source may be different from a voltage of the second power source. The first power line and the second power line may be on the first insulating layer. The display device may include a second insulating pattern between the first power line and the second power line in a plan view, the second insulating pattern planarizing the surface unevenness. At least a portion of the second insulating pattern may be between the data connection lines and the first power line and between the data connection lines and the second power line. The second insulating pattern may include a same material as that of the first insulating patterns.

In accordance with one or more additional embodiments, a display device includes a substrate including a display region to display an image, a non-display region at at least one side of the display region, an additional region protruding from a portion of the non-display region, and a bent region in the additional region; a plurality of pixels in the display region; data connection lines extending along the non-display region and the additional region, the data connection lines to apply data signals to the pixels; a first insulating layer on the substrate of the non-display region and the additional region, the first insulating layer including an opening that exposes the substrate of the bent region therethrough, the first insulating layer having a surface unevenness formed by the data connection lines; a bent insulating layer filling in the opening and including an organic material; scan connection lines on the first insulating layer in the non-display region and intersecting the data connection lines; and first insulating patterns on the first insulating layer and between at least adjacent scan connection lines in a plan view, the first insulating patterns planarizing the surface unevenness, wherein the first insulating patterns include a same material as the bent insulating layer.

At least a portion of the first insulating patterns may be between the data connection lines and the scan connection lines. The data connection lines may include first data connection lines on the substrate; and second data connection lines insulated from the first data connection lines through a second insulating layer between the substrate and the first insulating layer. The display device may include emission control connection lines in the non-display region, wherein the emission control connection lines are to apply an emission control signal to the pixels and wherein the power connection lines are to apply a power source to the pixels, and wherein the emission control connection lines and the power connection lines intersect the data connection lines, include a same material as the scan connection lines, and are on a same layer as that of the scan connection lines.

In a plan view, the first insulating patterns may be between adjacent lines among the scan connection lines, the power connection lines, and the emission control connection lines. The first insulating patterns may be connected to each other to form a first insulating pattern layer. The scan connection lines, the power connection lines, and the emission control connection lines may be on the first insulating pattern layer.

The display device may include an additional region at one side of the non-display region; a first power line extending from the additional region to the non-display region and connected to the power connection lines to supply a first power source to the pixels; and a second power line extending from the additional region to the non-display region, the second power line to supply a second power source to the pixels, wherein the data connection lines extend to the additional region and intersect the first power line and the second power line. The voltage of the first power source may be different from a voltage of the second power source. The first power line and the second power line may be on the first insulating layer.

The display device may include a second insulating pattern between the first power line and the second power line in a plan view, the second insulating pattern planarizing the surface unevenness. At least a portion of the second insulating pattern may be between the data connection lines and the first power line and between the data connection lines and the second power line. The second insulating pattern may include a same material as that of the first insulating patterns.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
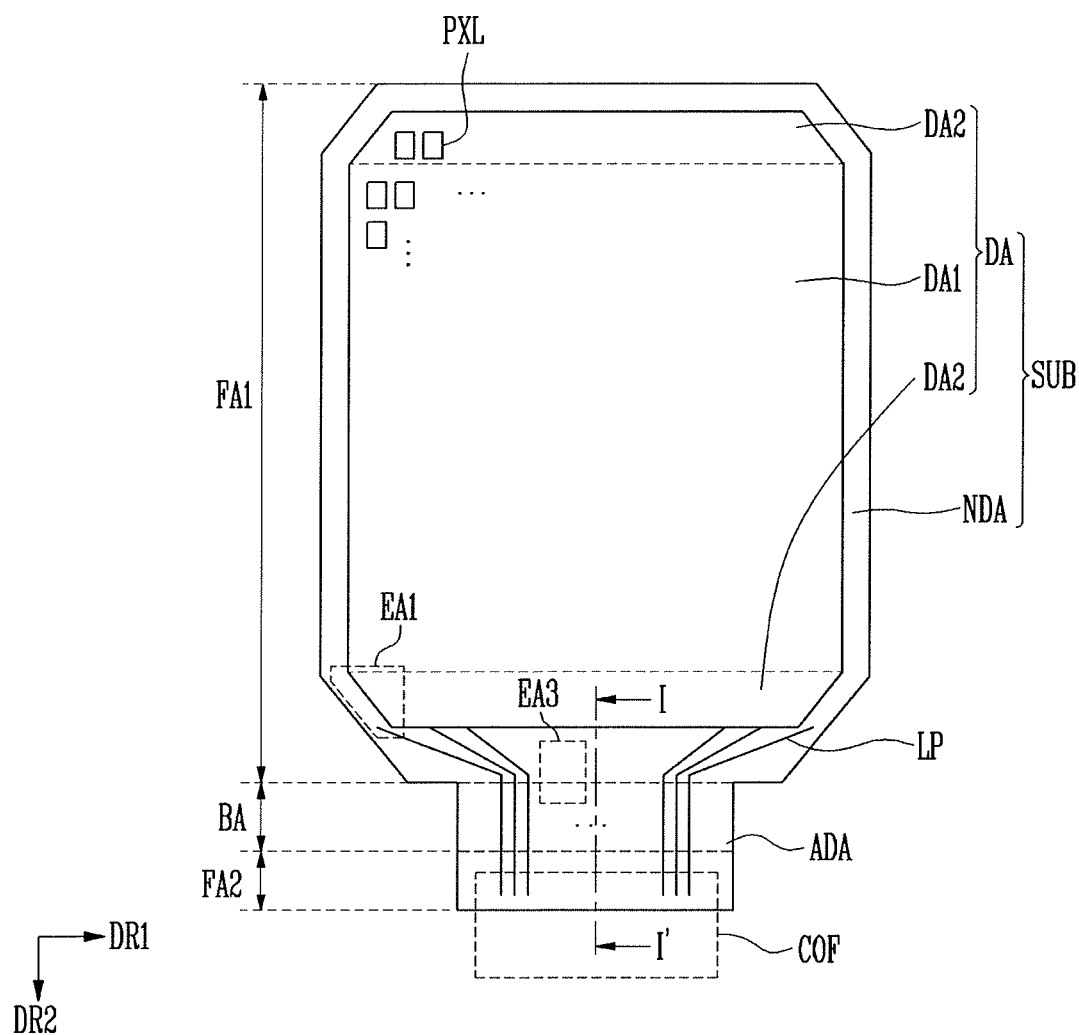
FIG. 1 illustrates an embodiment of a display device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Figure 2:
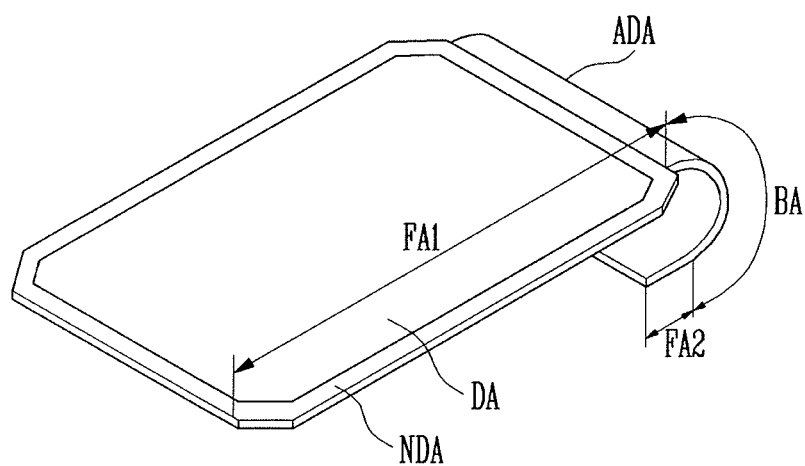
FIG. 2 illustrates a perspective view of the display device.

FIG. 1 illustrates an embodiment of a display device, and FIG. 2 illustrates a perspective view of the display device of FIG. 1 according to an embodiment.

Referring to FIGS. 1 and 2, the display device may include a substrate SUB, pixels provided on the substrate SUB, and a line unit LP connected to the pixels PXL. The substrate SUB may have a predetermined shape, e.g., an approximately rectangular shape. For example, in an embodiment, the substrate SUB may include a pair of short sides parallel to each other in a first direction DR1 and a pair of long sides parallel to each other in a second direction DR2.

The shape of the substrate SUB may be different in another embodiment. For example, in one embodiment, the substrate SUB may have a closed polygonal shape including linear sides. In one embodiment, the substrate SUB may have a circle or elliptical shape with curved sides, or a semicircle and a semi-elliptical shape with linear and curved sides. When the substrate SUB has linear sides, at least some of corners of each of the shapes may be formed, for example, in a curve. For example, when the substrate SUB has a rectangular shape, a portion at which adjacent linear sides meet each other may be replaced with a curve having a predetermined curvature. For example, a vertex portion of the rectangular shape may have a curved side having both adjacent ends respectively connected to two adjacent linear sides, and the curved side may have a predetermined curvature. The curvature may be different depending, for example, on position, e.g., the curvature may change depending on the starting position of the curve, the length of the curve, and/or another feature.

When the substrate SUB includes a plurality of regions, each region may have various shapes such as, for example, a closed polygon with linear sides, a circle or ellipse with curved sides, or a semicircle and a semi-ellipse with linear and curved sides.

The substrate may include a display region DA and a non-display region NDA at at least one side of the display region DA. The display region DA may include pixels that emit light for displaying an image. The display region DA may have various shapes, e.g., the display region DA may have a shape corresponding to the substrate SUB.

In an embodiment, the display region DA may include a first display region DA1 and two second display regions DA2. The second display regions DA2 may be at different sides of the first display region DA1 opposite to each other. The second display regions DA2 may have a shape, for example, having a width that becomes narrower in a direction away from the first display region DA1. For example, each of the second display regions DA2 may have a trapezoidal shape of which width becomes narrows with increasing distance from the first display region DA1. In one embodiment, the second display regions DA2 may have a trapezoidal shape. In one embodiment, the second display regions DA2 may have a shape in which two inclined sides of the trapezoidal shape are replaced with curves.

The pixels PXL may be in the display region DA on the substrate SUB. Each of the pixels PXL may be considered to be a minimum unit that emits light for displaying an image. In one embodiment, each pixel PXL may include an organic light emitting device that emits white light and/or colored light. Each pixel PXL may emit, for example, red, green, or blue light, or may emit cyan, magenta, yellow, or white light.

The pixels PXL may be arranged in a matrix form along a plurality of rows extending in the first direction DR1 and a plurality of columns extending in the second direction DR2. In an embodiment, the arrangement of the pixels PXL is not particularly limited, and the pixels PXL may be arranged in various forms. For example, some of the pixels PXL may be arranged such that the first direction DR1 becomes the row direction, but others of the pixels PXL may be arranged such that the row direction becomes a direction different from the first direction DR1, e.g., a direction oblique to the first direction DR1.

Each of the pixels PXL may include a display element in the form of an organic light emitting device that includes an organic emitting layer. In another embodiment, each of the pixels PXL may include other types of display elements such as a liquid crystal element, an electrophoretic element, or an electrowetting element.

The non-display region NDA does not include pixels PXL and thus does not emit light for display an image. The non-display region NDA may be at at least one side of the display region DA. In an embodiment, the non-display region NDA may surround or be adjacent to the circumference of the display region DA. In an embodiment, the non-display region NDA may include a lateral part extending in the width direction thereof and a longitudinal part extending the length direction thereof. The longitudinal part of the non-display region NDA may be provided in a pair and spaced apart from each other along the width direction of the display region DA.

The non-display region NDA is provided with a driving unit for driving the pixels PXL and lines of the line unit LP, through which the pixels PXL and the driving unit are connected to each other. The non-display region NDA corresponds to a bezel in a final display device, and the width of the bezel may be determined according to the width of the non-display region NDA.

The line unit LP may be connected to the pixels PXL. The line unit LP allows signals to be provided to the pixel PXLs and, for example, may include scan connection lines connected to scan lines of the display region DA, data connection lines connected to data lines of the display region DA, power lines for applying a power source to each pixel PXL, and/or other lines.

The line unit LP may be provided throughout the display region DA and the non-display region NDA. The line unit LP may be connected to the driving unit, which provides signals to the pixels PXL through the line unit LP. Accordingly, driving of each pixel PXL may be controlled.

The driving unit may include, for example, a scan driver for providing a scan signal to each pixel PXL along the scan line, a data driver for providing data signals to the pixels PXL along data lines, and a timing controller for controlling the scan driver and the data driver.

In an embodiment, the scan driver may be directly mounted on the substrate SUB. When the scan driver is directly mounted on the substrate SUB, the scan driver may be formed together with the pixels PXL in a process of forming the pixels PXL. The mounting position and forming method of the scan driver may be different in another embodiment. For example, the scan driver may be formed on a separate chip, e.g., provided in the form of a chip on glass on the substrate SUB. In one embodiment, the scan driver may be mounted on a printed circuit board and connected to the substrate SUB through a connector.

In an embodiment, the data driver may be directly mounted on the substrate SUB. In one embodiment, the data driver may be formed on a separate chip and connected to the substrate SUB. In an embodiment, when the data driver is on a separate chip and connected to the substrate, the data driver may be provided in the form of a chip on glass or chip on plastic. In one embodiment, the data driver may be mounted on a printed circuit board and connected to the substrate SUB through a connector. In an embodiment, the data driver may be manufactured, for example, in the form of a chip on film (COF) and connected to the substrate SUB.

In an embodiment, the non-display region NDA may include an additional region ADA that protrudes from a portion thereof. The additional region ADA may protrude from sides constituting the non-display region NDA. In an embodiment, a case where the additional region ADA protrudes from a side corresponding to one of the short sides of the substrate SUB is illustrated as an example. However, the additional region ADA may protrude from one of the long sides of the substrate SUB or may be provided in a shape protruding from two sides among the four sides of the substrate SUB in another embodiment. In an embodiment, a data driver may be provided or connected to the additional region ADA. However, in other embodiments, various components may be disposed in the additional region ADA.

In an embodiment, at least a portion of the display device may have flexibility, and the display device may be folded at the portion having flexibility. For example, the display device may include a bent region BA that has flexibility and is bent in one direction, and a flat region FA that is at one side of the bent region BA and is flat without being folded. The flat region FA may or may not have flexibility.

In an embodiment, a case where the bent region BA is provided in the additional region ADA is illustrated as an example. According an embodiment, a first flat region FA1 and a second flat region FA2 may be spaced apart from each other, with the bent region BA therebetween, and the first flat region FA1 may include the display region DA. Therefore, the bent region BA may be spaced apart from the display region DA.

In the bent region BA, a line along which the display device is folded may be referred to as a folding line. Such a folding line may be in the bent region BA. The term "folded" does not mean a fixed shape but means a shape deformable into another shape from the original shape and, for example, includes a shape folded, curved, or rolled like a roll along one or more specific lines, e.g., one or more folding lines. In an embodiment, the display device may be folded such that surfaces of the two flat regions FA1 and FA2 are parallel to each other and are folded to face each other. In embodiment, the display device may be folded such that surfaces of the two flat regions FA1 and FA2 form a predetermined angle (e.g., an acute angle, a right angle, or an obtuse angle), with the bent region BA therebetween. Other types of folding and folding lines may exist in other embodiments. The additional region ADA may be bent along the folding line in a subsequent process. In this case, as the additional region ADA is bent, the width of a bezel may be decreased.

Figure 3:
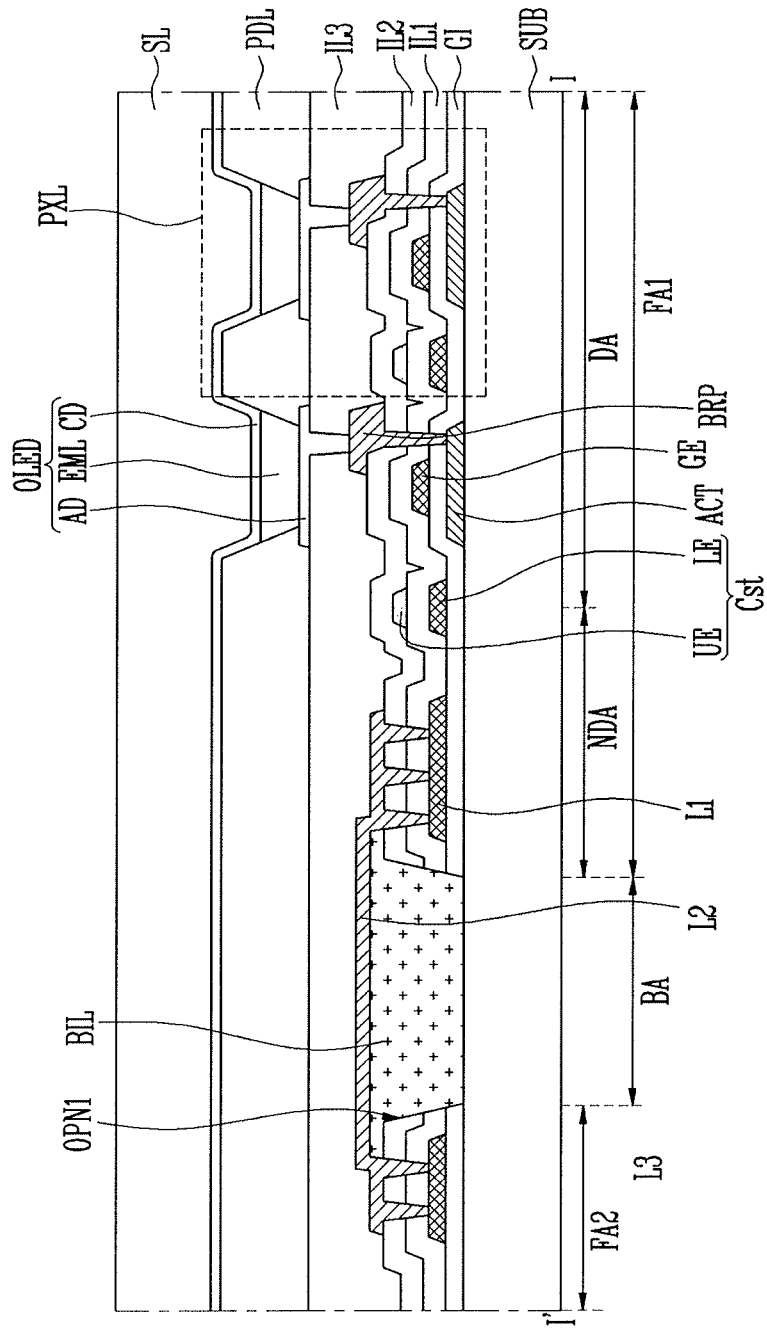
FIG. 3 illustrates a sectional view taken along line I-I' of FIG. 1.

FIG. 3 illustrates a sectional view taken along line I-I' of FIG. 1 according to one embodiment. Referring to FIGS. 1 to 3, the display device may include the bent region BA, and the first flat region FA1 and the second flat region FA2 which are spaced apart from each other, with the bent region BA therebetween. The first flat region FA1 may include the display region DA and the non-display region NDA. Therefore, the bent region BA may be spaced apart from the display region DA.

The plurality of pixels PXL are in the display region DA. Each pixel PXL may include a transistor connected to a corresponding line in the line unit LP, an organic light emitting device connected to the transistor, and a capacitor Cst. The transistor may include a driving transistor for controlling the organic light emitting device and a switching transistor for switching the driving transistor.

For convenience of description, a case is illustrated in FIG. 3 wherein each pixel includes one transistor and one capacitor. In other embodiments, two or more transistors and one or more capacitors may be provided in one pixel PXL. In one embodiment, three or more transistors and two or more capacitors may be provided in one pixel PXL.

The pixels PXL may be on the substrate SUB. The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

In one embodiment, the substrate SUB may be a flexible substrate. In this case, the substrate SUB may be, for example, one of a film substrate and a plastic substrate including a polymer organic material. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be different in other embodiments, e.g., may include a fiber reinforced plastic (FRP), etc.

A buffer layer may be on the substrate SUB to prevent impurities from diffusing into the switching and driving transistors. The buffer layer may be an inorganic insulating layer made of an inorganic material. For example, the buffer layer may be formed of silicon nitride, silicon oxide, silicon oxynitride, etc. In one embodiment, the buffer layer may be omitted according to material and process conditions.

An active pattern ACT may be on the buffer layer and include a semiconductor material. The active pattern ACT may include a source region, a drain region, and a channel region between the source region and the drain region. The active pattern ACT may be, for example, a semiconductor pattern made of poly-silicon (p-Si), amorphous silicon (a-Si), oxide semiconductor, etc. The channel region is a semiconductor pattern undoped with impurities and, for example, may be an intrinsic semiconductor. The source region and the drain region are semiconductor patterns dope with impurities. The impurities may include an n-type impurity, a p-type impurity, and other metals.

A gate insulating layer GI may be over the active pattern ACT and may include at least an inorganic insulating layer. The inorganic insulating layer may include, for example, at least one of polysiloxane, silicon nitride, silicon oxide, silicon oxynitride, and equivalents thereof.

A gate electrode GE and a capacitor lower electrode LE may be on the gate insulating layer GI and may cover a region corresponding to the channel region of the active pattern ACT.

The gate electrode GE and the capacitor lower electrode LE may include a metallic material. For example, the gate electrode GE may include at least one of metals such as gold (Au), silver (Ag), aluminum (Al), molybdenum (Mo), chromium (Cr), titanium (Ti), nickel (Ni), neodymium (Nd), and copper (Cu), or alloys thereof. The gate electrode GE may have a single-layered structure or a multi-layered structure, in which conductive layers including at least one of the metals and the alloys are stacked.

In an embodiment, other conductive lines including scan lines may be formed of the same material in the same layer as the gate electrode GE and the capacitor lower electrode LE. The other lines including the scan lines may be directly or indirectly connected to a portion of the transistor in each pixel unit PXL, e.g., gate electrode GE.

A first interlayer insulating layer IL1 may be over the gate electrode GE and the capacitor lower electrode LE. The first interlayer insulating layer IL1 may be an inorganic insulating layer including an inorganic material. The inorganic insulating layer may include, for example, polysiloxane, silicon nitride, silicon oxide, and/or silicon oxynitride.

A capacitor upper electrode UE may be on the first interlayer insulating layer IL1 and may include a metallic material. For example, the capacitor upper electrode UE may include at least one of metals such as gold (Au), silver (Ag), aluminum (Al), molybdenum (Mo), chromium (Cr), titanium (Ti), nickel (Ni), neodymium (Nd), and copper (Cu), or alloys thereof. The capacitor upper electrode UE may have a single-layered structure or a multi-layered structure, in which conductive layers including at least one of the metals and the alloys are stacked.

The capacitor Cst may include a first interlayer insulating layer IL1 between the capacitor lower electrode LE and the capacitor upper electrode UE. In an embodiment, the capacitor Cst is configured with the capacitor lower electrode LE and the capacitor upper electrode UE. The capacitor Cst may be implemented in a different manner in another embodiment.

A second interlayer insulating layer IL2 may be over the capacitor upper electrode UE and may be an inorganic insulating layer including an inorganic material. The inorganic insulating layer may include, for example, polysiloxane, silicon nitride, silicon oxide, and silicon oxynitride.

A bridge pattern BRP may be on the second interlayer insulating layer IL2 and may be connected to a source electrode or a drain electrode of the active pattern ACT through a contact hole in the gate insulating layer GI, the first interlayer insulating layer IL1, and the second interlayer insulating layer IL2. The bridge pattern BRP may include a metallic material, e.g., at least one of metals such as gold (Au), silver (Ag), aluminum (Al), molybdenum (Mo), chromium (Cr), titanium (Ti), nickel (Ni), neodymium (Nd), and copper (Cu), or alloys thereof. The bridge pattern BRP may have a single-layered structure or a multi-layered structure, in which conductive layers including at least one of the metals and the alloys are stacked.

In an embodiment, data lines or power lines may be formed of the same material in the same layer as the bridge pattern BRP. The data lines or the power lines may be directly or indirectly connected to a portion of the transistor in each pixel unit PXL, e.g., the source electrode and/or the drain electrode.

A third interlayer insulating layer IL3 may be over the bridge pattern BRP and may include an organic insulating material. For example, the third interlayer insulating layer IL3 may include at least one of a photoresist, polyacrylate resin, epoxy resin, phenolic resin, polyamide resin, polyimide resin, unsaturated polyester resin, polyphenylene ether resin, polyphenylene sulfide resin, and benzocyclobutene resin.

In one embodiment, an inorganic insulating layer including an inorganic material may be between the bridge pattern BRP and the third interlayer insulating layer IL3. The inorganic insulating layer may cover the second interlayer insulating layer IL2 on which the bridge pattern BRP is provided.

An organic light emitting device OLED may be on the third insulating layer IL3 and may include a first electrode AD, a second electrode CD, and an emitting layer EML between the first electrode AD and the second electrode CD. The first electrode AD may be on the third interlayer insulating layer IL3 and may be connected to the bridge pattern BRP through a contact hole passing through the third interlayer insulating layer IL3. Since the bridge pattern BRP is connected to the source electrode or the drain electrode of the transistor, the first electrode AD may be connected to one of the source electrode and the drain electrode.

A pixel defining layer PDL defines a light emitting region for each pixel PXL and may be on the substrate SUB on which the first electrode AD and the like are formed. The pixel defining layer PDL may expose an upper surface of the first electrode AD therethrough and protrude from the substrate SUB along the circumference of the pixel unit PXL.

The emitting layer EML may be in the light emitting region surrounded by the pixel defining layer PDL. The second electrode CD may be on the emitting layer EML. An encapsulation layer SL may cover the second electrode CD and may be over the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

At least one of the first electrode AD and the second electrode CD may be a transmissive electrode. For example, when the organic light emitting device OLED is a bottom-emission organic light emitting device, the first electrode AD may be a transmissive electrode, and the second electrode CD is a reflective electrode. When the organic light emitting device OLED is a top-emission organic light emitting device, the first electrode AD may be a reflective electrode, and the second electrode CD may be a transmissive electrode. When the light emitting device OLED is a dual-emission organic light emitting device, both of the first electrode AD and the second electrode CD may be transmissive electrodes. In this embodiment, a case where the organic light emitting device OLED is a top-emission organic light emitting device and the first electrode AD is an anode electrode is described as an example.

The first electrode AD may include a reflective layer for reflecting light and a transparent conductive layer over or under the reflective layer. At least one of the transparent conductive layer and the reflective layer may be connected to the drain electrode. The reflective layer may include a material capable of reflecting light, e.g., at least one of aluminum (Al), silver (Ag), chromium (Cr), molybdenum (Mo), platinum (Pt), nickel (Ni), and alloys thereof. The transparent conductive layer may include a transparent conductive oxide. For example, the transparent conductive layer may include at least one transparent conductive oxide, e.g., indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material, e.g., at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be on the exposed surface of the first electrode AD and may have a multi-layered thin film structure at least including a light generation layer (LGL). For example, the emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron injection layer (EIL) for injecting electrons. The HIL, HTL, HBL, ETL, and EIL may be common layers connected in adjacent light emitting regions.

The color of light generated in the LGL may be any of the colors of light previously mentioned, e.g., red, green, blue, white, magenta, cyan, and yellow.

The second electrode CD may be a semi-transmissive reflective layer. For example, the second electrode CD may be a thin metal layer having a thickness, through which light emitted through the emitting layer EML may be transmitted. The second electrode CD may allow a portion of the light emitted from the emitting layer EML to be transmitted therethrough, and may allow the rest of the light emitted from the emitting layer EML to be reflected therefrom.

The second electrode CD may include a material having a work function lower than that of the transparent conductive layer of the first electrode AD. For example, the second electrode CD may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the emitting layer EML may not be transmitted through the second electrode CD. The light reflected from the second electrode CD may be again reflected from the reflective layer. For example, the light emitted from the emitting layer EML may resonate between the reflective layer and the second electrode CD. The light extraction efficiency of the organic light emitting device OLED may be improved by resonance of the light.

The distance between the reflective layer and the second electrode CD may be changed depending on a color of the light emitted from the emitting layer EML. That is, the distance between the reflective layer and the second electrode CD may be adjusted to correspond to a resonance distance, depending on a color of the light emitted from the emitting layer EML.

The encapsulation layer SL prevents oxygen and moisture from penetrating into the organic light emitting device OLED. The encapsulation layer SL may include a plurality of inorganic layers and a plurality of organic layers. For example, the encapsulation layer SL may include a plurality unit encapsulation layers including the inorganic layer and the organic layer on the inorganic layer. The inorganic layer may be at the uppermost portion of the encapsulation layer SL. The inorganic layer may include at least one of silicon oxide, silicon nitride, silicon oxynitride, aluminum oxide, titanium oxide, zirconium oxide, and tin oxide.

Next, the non-display region NDA will be described. Hereinafter, as for the non-display region NDA, contents that have been already described will be omitted or briefly described to avoid redundancy.

In an embodiment, the line unit LP may be in the non-display region NDA. The bent region BA in which the substrate SUB is folded may be in the non-display region NDA. The line unit LP may include lines through which the driving unit and the pixels PXL are connected to each other. For example, the line unit LP may include scan lines, data lines, power lines, and the like.

The lines may extend approximately in the second direction DR2 from the pixels PXL to allow the pixels PXL and the driving unit to be connected to each other therethrough. The lines may extend up to an end portion of the additional region ADA in the second direction DR2, and contact electrodes may be at the end portion. The pixels PXL may be connected to the driving unit provided in the form of a chip on film, etc. through the contact electrodes connected to the lines.

The lines may include a first line L1, a second line L2, and a third line L3. The lines in the non-display region NDA may be implemented, for example, in the following stack structure. Therefore, this will be described with reference to FIG. 3. For convenience of description, only portions of the first line L1, the second line L2, and the third line L3 are schematically illustrated in FIG. 3.

The buffer layer may be on the non-display region NDA of the substrate SUB, and the gate insulating layer GI may be on the buffer layer.

The first line L1 and the third line L3 may be on the gate insulating layer GI. The first line L1 may be in the first flat region FA1. The third line L3 may be in the second flat region FA2. The first line L1 and the third line L3 may be formed, for example, of the same material through the same process as the gate electrode GE.

The first interlayer insulating layer IL1 may be over the first line L1 and the third line L3. The second interlayer insulating layer IL2 may be on the first interlayer insulating layer IL1.

A first opening OPN1 may be in the insulating layers, e.g., the buffer layer, the gate insulating layer GI, the first interlayer insulating layer IL1, and the second interlayer insulating layer IL2, which are provided in the bent region BA. The bent region BA is a region in which the substrate SUB is bent. For example, the buffer layer, the gate insulating layer GI, the first interlayer insulating layer IL1, and the second interlayer insulating layer IL2 may have the first opening OPN1 in which their portions corresponding to the bent region BA are removed.

That the first opening OPN1 corresponds to the bent region BA may be understood as that the first opening OPN1 overlaps with the bent region BA. The area of the first opening OPN1 may be, for example, wider than that of the bent region BA. In an embodiment, the width of the first opening OPN1 may be equal to that of the bent region BA. In one embodiment, the width of the first opening OPN1 may be wider than that of the bent region BA.

A bent insulating layer BIL may be in the first opening OPN1 and may fill in at least a portion of the first opening OPN1. An example of case where the bent insulating layer BIL fills in the entire opening OPN1 is illustrated in FIG. 3. In an embodiment, the bent insulating layer BIL may cover a region adjacent to the first opening OPN1, e.g., an upper portion of the second interlayer insulating layer IL2 corresponding to the first flat region FA1 and/or the second flat region FA2 while filling in the first opening OPN1.

The bent insulating layer BIL may be an organic insulating layer including an organic material. The bent insulating layer BIL may include an organic insulating material, e.g., a polyacryl-based compound, a polyimide-based compound, a fluorine-based compound such as Teflon, or a benzocyclobutene-based compound.

The second line L2 may be on the second interlayer insulating layer IL2 and the bent insulating layer BIL. The second line L2 may be formed, for example, of the same material through the same process as the bridge pattern BRP. The second line L2 extends from the first flat region FA1 to the second flat region FA2 via the bent region BA, and is on the bent insulating layer BIL. The second line L2 may be on the second interlayer insulating layer IL2 at a portion at which the bent insulating layer BIL is not provided.

As described above, a state in which the display device is not bent is illustrated in FIG. 3, but in one embodiment the display device may be bent in the bent region BA. In one embodiment, the display device may be manufactured in a state in which it is flat and then may be bent. When the display device is bent after it is manufactured, tensile stress may be applied to the second line L2 in a process of bending the substrate SUB, etc. However, as described above, the second line L2 is on the second interlayer insulating layer IL2 made of an organic material having elasticity and flexibility. As a result, the likelihood of a failure in the second line L2 may be reduced or minimized. For example, in an embodiment, inorganic insulating layers made of an inorganic material having low flexibility and elasticity are removed in the bent region BA, so that it is possible to maintain the flexibility and elasticity of the substrate SUB. Further, it is possible to prevent a defect that otherwise may occur when insulating layers made of an inorganic material having low flexibility and elasticity are bent.

In an embodiment, the bent region BA corresponds to the portions at which the inorganic insulating layers are removed. In one embodiment, the bent region BA may not correspond to the portions at which the inorganic insulating layers are removed. For example, the bent region BA may roughly correspond to portions at which the inorganic insulating layers are removed, but may be wider or narrower than the portions at which the inorganic insulating layers are removed. Also, in an embodiment, the bent region BA is located in only the non-display region NDA. In one embodiment, the bent region BA may be provided throughout the non-display region NDA and the display region DA, or may be provided in the display region DA.

The third interlayer insulating layer IL3, the pixel defining layer PDL, and the encapsulation layer SL may be sequentially stacked on the substrate SUB on which the second line L2 is formed.

Figure 4:
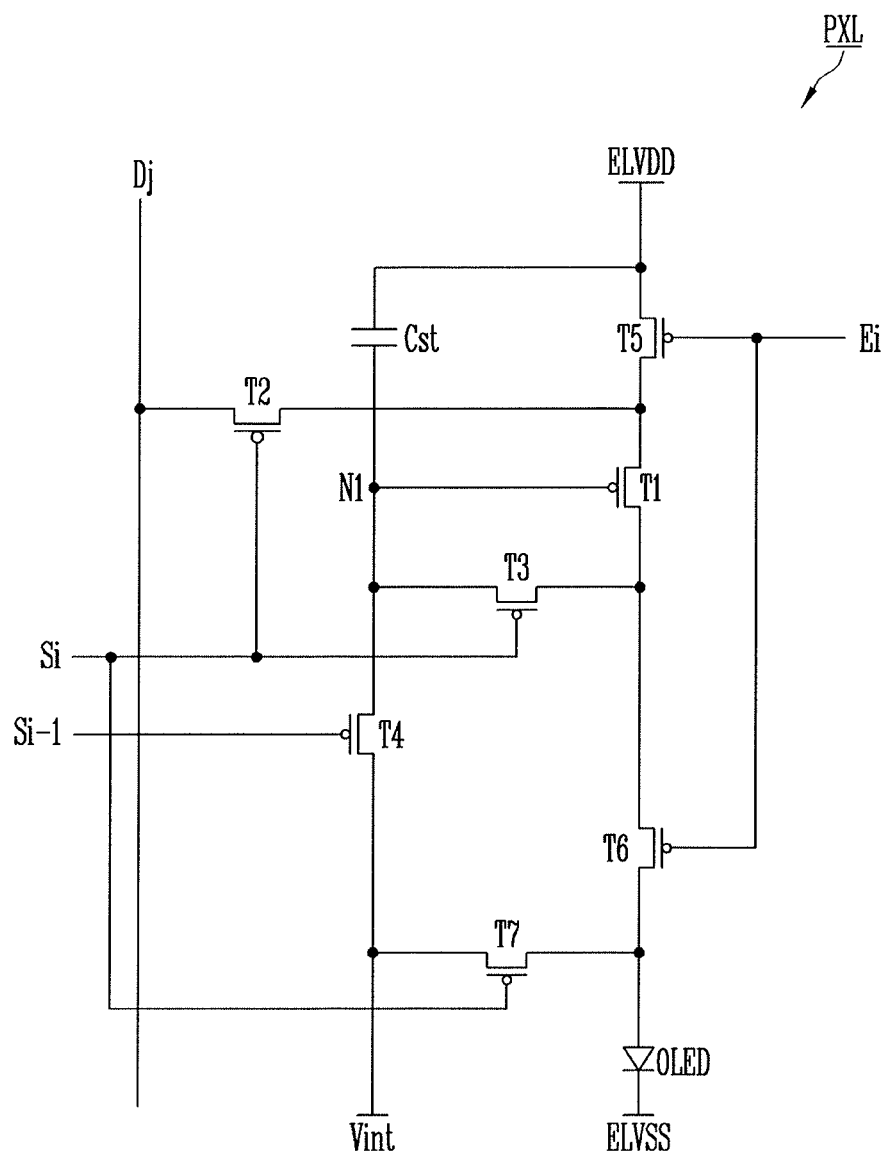
FIG. 4 illustrates a circuit embodiment of a pixel.

FIG. 4 illustrates an embodiment of an equivalent circuit diagram of a pixel PXL, which, for example, may be representative of the pixels of FIGS. 1 to 3. For convenience, pixel PXL is illustrated to be connected to a jth data line Dj and an ith scan line Si.

Referring to FIG. 4, the pixel PXL may include an organic light emitting device OLED, a first transistor T1, a second transistor T2, a third transistor T3, a fourth transistor T4, a fifth transistor T5, a sixth transistor T6, a seventh transistor T7, and a storage capacitor Cst.

The organic light emitting device OLED has an anode connected to the first transistor T1 via the sixth transistor T6 and a cathode connected to a second power source ELVSS. The organic light emitting device OLED may generate light with a predetermined luminance corresponding to the amount of current supplied from the first transistor T1.

A first power source ELVDD may be set to a voltage higher than that of the second power source ELVSS, to allow current to flow in the organic light emitting device OLED.

The seventh transistor T7 may be connected between the initialization power source Vint and the anode of the organic light emitting device OLED. A gate electrode of the seventh transistor T7 may be connected to the ith scan line Si. The seventh transistor T7 may be turned on when a scan signal is supplied to the ith scan line Si, to supply the voltage of the initialization power source Vint to the anode of the organic light emitting device OLED. The initialization power source Vint may be set, for example, to a voltage lower than a data signal.

The sixth transistor T6 may be connected between the first transistor T1 and the organic light emitting device OLED. A gate electrode of the sixth transistor T6 may be connected to an ith emission control line Ei. The sixth transistor T6 may be turned off when an emission control signal is supplied to the ith emission control line Ei, and be turned on otherwise.

The fifth transistor T5 may be connected between the first power source ELVDD and the first transistor T1. A gate electrode of the fifth transistor T5 may be connected to the ith emission control line Ei. The fifth transistor T5 may be turned off when the emission control signal is supplied to the ith emission control line Ei, and be turned on otherwise.

A first electrode of the first transistor (drive transistor) T1 may be connected to the first power source ELVDD via the fifth transistor T5. A second electrode of the first transistor T1 may be connected to the anode of the organic light emitting device OLED via the sixth transistor T6. A gate electrode of the first transistor T1 may be connected to a first node N1. The first transistor T1 may control the amount of current flowing from the first power source ELVDD to the second power source ELVSS, via the organic light emitting device OLED, corresponding to a voltage of the first node N1. Thus, the first power source ELVDD may be electrically connected to the anode of the organic light emitting device OLED through the first transistor T1.

The third transistor T3 may be connected between the second electrode of the first transistor T1 and the first node N1. A gate electrode of the third transistor T3 may be connected to the ith scan line Si. The third transistor T3 may be turned on when a scan signal is supplied to the ith scan line Si, to allow the second electrode of the first transistor T1 to be electrically connected to the first node N1. Therefore, when the third transistor T3 is turned on, the first transistor T1 may be diode-connected, and the third transistor T3 may compensate form a threshold voltage of the first transistor T1. Thus, third transistor T3 may be a compensation transistor that compensates for the threshold voltage of the first transistor T1.

The fourth transistor T4 may be connected between the first node N1 and the initialization power source Vint. A gate electrode of the fourth transistor T4 may be connected to an (i−1)th scan line Si−1. The fourth transistor T4 may be turned on when a scan signal is supplied to the (i−1)th scan line Si−1, to supply the voltage of the initialization power source Vint to the first node N1.

The second transistor T2 may be connected between the jth data line Dj and the first electrode of the first transistor T1. A gate electrode of the second transistor T2 may be connected to the ith scan line Si. The second transistor T2 may be turned on when a scan signal is supplied to the ith scan line Si, to allow the jth data line Dj to be electrically connected to the first electrode of the first transistor T1.

The storage capacitor Cst may be connected between the first power source ELVDD and the first node N1. The storage capacitor Cst may store a voltage corresponding to the data signal and the threshold voltage of the first transistor T1.

Figure 5:
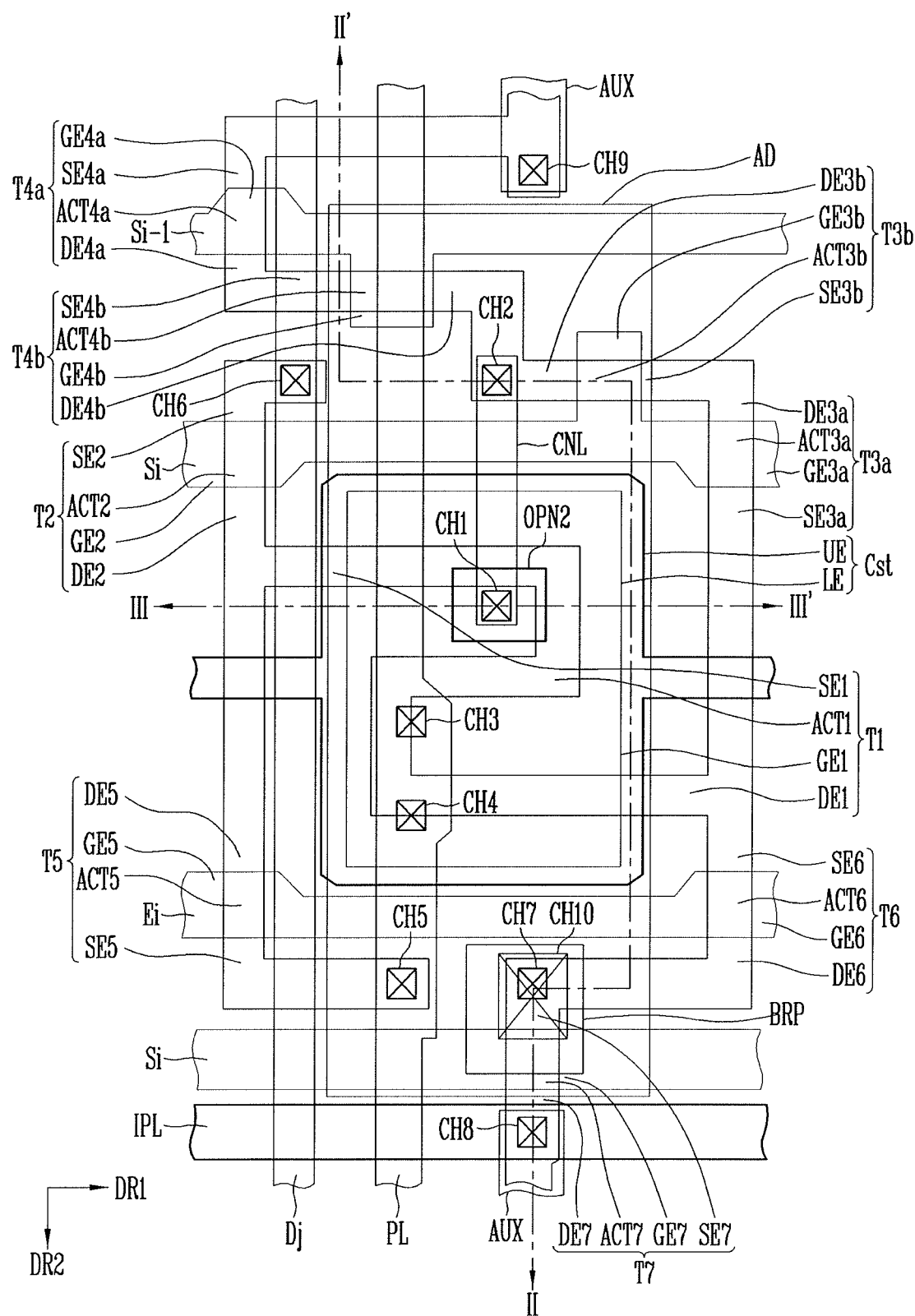
FIG. 5 illustrates a layout embodiment of the pixel.
Figure 6:
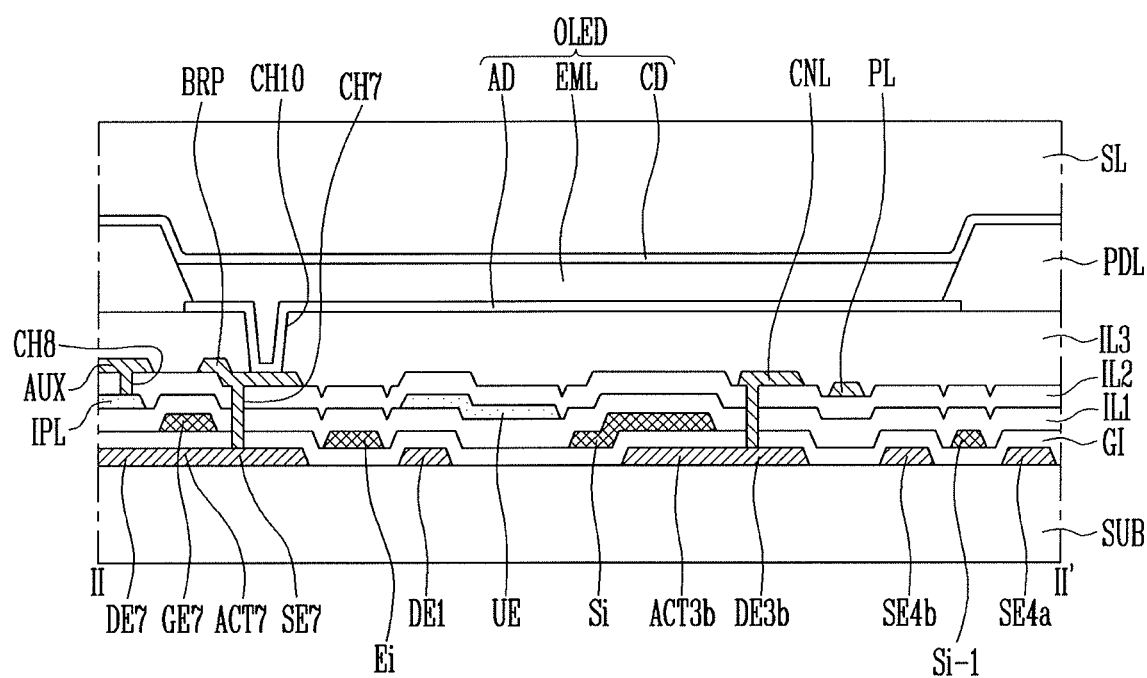
FIG. 6 illustrates a sectional view taken along line II-II' of FIG. 5.
Figure 7:
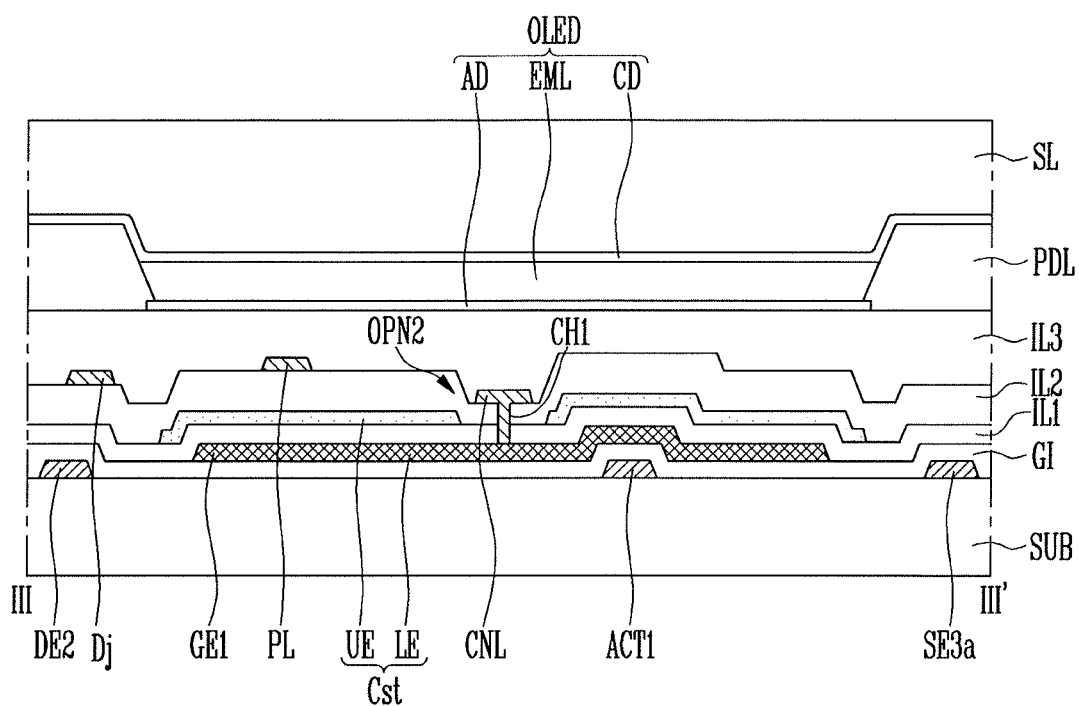
FIG. 7 illustrates another sectional view taken along line III-III' of FIG. 5.

FIG. 5 illustrates a plan view of the pixel of FIGS. 1 to 3 according to an embodiment. FIG. 6 illustrates a sectional view taken along line II-II' of FIG. 5 according to an embodiment. FIG. 7 illustrates a sectional view taken along line III-III' of FIG. 5 according to an embodiment.

Referring to FIGS. 1 to 7, the display device may include the substrate SUB including the display region DA and the non-display region NDA, the pixels PXL in the display region DA, and the line unit LP that allows signals to be provided to the pixels PXL therethrough. The substrate SUB may include a transparent insulating material to enable light to be transmitted therethrough. The substrate SUB may be a rigid substrate or a flexible substrate.

The line unit LP may allow signals to be provided to each of the pixels PXL therethrough. The line unit LP may include, for example, scan lines Si−1 and Si, data lines Dj, emission control lines Ei, a power line PL, and an initialization power line IPL.

The scan lines Si−1 and Si may extend in the first direction DR1. For example, the scan lines Si−1 and Si may have a shape extending from one to the other of the longitudinal parts of the non-display region NDA, which are at different sides of the display region DA. The scan lines Si−1 and Si may include an (i−1)th scan line Si−1 and an ith scan line Si, which are sequentially arranged along the second direction DR2. The scan lines Si−1 and Si may receive scan signals applied thereto. For example, the (i−1)th scan line Si−1 may receive an (i−1)th scan signal applied thereto. Pixels PXL connected to the ith scan line Si may be initialized by the (i−1)th scan signal applied to the (i−1)th scan line Si−1. The ith scan line Si may receive an ith scan signal applied thereto. The ith scan line Si may branch off to be connected to different transistors.

The emission control line Ei may extend in the first direction DR1 and may receive an emission control signal applied thereto. The data line Dj may extend in the second direction DR2 and may receive a data signal applied thereto. Therefore, the data line Dj may intersect the scan lines Si−1 and Si and the emission control line Ei. The power line PL may extend along the second direction DR2 and may intersect the scan lines Si−1 and Si and the emission control line Ei. The power line PL may be spaced apart from the data line Dj and may receive the first power source ELVDD applied thereto. The initialization power line IPL may extend along the first direction DR1 and may receive the initialization power source Vint applied thereto.

Each of the pixels PXL may include first to seventh transistors T1 to T7, a storage capacitor Cst, and an organic light emitting device OLED.

The first transistor T1 may include a first gate electrode GE1, the first active pattern ACT1, a first source electrode SE1, a first drain electrode DE1, and a connection line CNL. The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. The connection line CNL may have one end connected to the first gate electrode GE1 through a first contact hole CH1 and another end connected to the third and fourth drain electrodes DE3 and DE4 through a second contact hole CH2.

In an embodiment, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the active pattern ACT1 may be formed of a semiconductor layer undoped with impurities.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2. The second gate electrode GE2 may be connected to the ith scan line Si. The second gate electrode GE2 may be a portion of the ith scan line Si or may be in a shape protruding from the ith scan line Si. In an embodiment, the second active pattern ACT2, the second source electrode SE2, and the second drain electrode DE2 may be formed of a semiconductor undoped or doped with impurities. For example, the second source electrode SE2 and the second drain electrode DE2 may be formed of a semiconductor doped with impurities, and the second active pattern ACT2 may be formed of a semiconductor layer undoped with impurities. The second active pattern ACT2 corresponds to a portion overlapping with the second gate electrode GE2.

The second source electrode SE2 may have one end connected to the second active pattern ACT2 and another end connected to the data line Dj through a sixth contact hole CH6. The second drain electrode DE2 may have one end connected to the second active pattern ACT2 and another end connected to the first source electrode SE1 of the first transistor T1 and the fifth drain electrode DE5 of the fifth transistor T5.

The third transistor T3 may have, for example, double-gate structure to prevent a leakage current. For example, the third transistor T3 may include a 3ath transistor T3*a* and a 3bth transistor T3*b*. The 3ath transistor T3*a* may include a 3ath gate electrode GE3*a*, a 3ath active pattern ACT3*a*, a 3ath source electrode SE3*a*, and a 3ath drain electrode DE3*a*. The 3bth transistor T3*b* may include a 3bth gate electrode GE3*b*, a 3bth active pattern ACT3*a*, a 3bth source electrode SE3*b*, and a 3bth drain electrode DE3*b*. The 3ath gate electrode GE3*a* and the 3bth gate electrode GE3*b* may be referred to as a third gate electrode GE3. The 3ath active pattern ACT3*a* and the 3bth active pattern ACT3*b* may be referred to as a third active pattern ACT3. The 3ath source electrode SE3*a* and the 3bth source electrode SE3*b* may be referred to as the third source electrode SE3. The 3ath drain electrode DE3*a* and the 3bth drain electrode DE3*b* may be referred to as the third drain electrode DE3.

The third gate electrode GE3 may be connected to the ith scan line Si and may be a portion of the ith scan line Si or may be provided in a shape protruding from the ith scan line Si. For example, the 3ath gate electrode GE3*a* may have a shape protruding from the ith scan line Si, and the 3bth gate electrode GE3*b* may be a portion of the ith scan line Si.

The third active pattern ACT3, the third source electrode SE3, and the third drain electrode DE3 may be formed of a semiconductor layer undoped or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. The third source electrode SE3 may have one end connected to the third active pattern ACT3 and another end of the third source electrode SE3 connected to the first drain electrode DE1 of the first transistor T1 and the sixth source electrode SE6 of the sixth transistor T6. The third drain electrode DE3 may have one end connected to the third active pattern ACT3 and another end connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may have, for example, a double-gate structure to prevent a leakage current. For example, the fourth transistor T4 may include a 4ath transistor T4*a* and a 4bth transistor T4*b*. The 4ath transistor T4*a* may include a 4ath gate electrode GE4*a*, a 4ath active pattern ACT4*a*, a 4ath source electrode SE4*a*, and a 4ath drain electrode DE4*a*, and the 4bth transistor T4*b* may include a 4bth gate electrode GE4*b*, a 4bth active pattern ACT4*b*, a 4bth source electrode SE4*b*, and a 4bth drain electrode DE4*b*. The 4ath gate electrode GE4*a* and the 4bth gate electrode GE4*b* may be referred to as a fourth gate electrode GE4. The 4ath active pattern ACT4*a* and the 4bth active pattern ACT4*b* may be referred to as a fourth active pattern ACT4. The 4ath source electrode SE4*a* and the 4bth source electrode SE4*b* may be referred to as a fourth source electrode SE4. The 4ath drain electrode DE4*a* and the 4bth drain electrode DE4*b* may be referred to as the fourth drain electrode DE4.

The fourth gate electrode GE4 may be connected to the (i-1)th scan line Si-1. The fourth gate electrode GE4 may be a portion of the (i-1)th scan line Si-1 or may be provided in a shape protruding from the (i-1)th scan line Si-1. For example, the 4ath gate electrode GE4*a* may be a portion of the (i-1)th scan line Si-1. The 4bth gate electrode GE4*b* may have a shape protruding from the (i-1)th scan line Si-1.

The fourth active pattern ACT4, the fourth source electrode SE4, and the fourth drain electrode DE4 may be formed of a semiconductor layer undoped or doped with impurities. For example, the fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4.

The fourth source electrode SE4 may have one end connected to the fourth active pattern ACT4 and another end connected to an initialization power line IPL of a pixel PXL on an (i-1)th row and a seventh drain electrode DE7 of a seventh transistor T7 of the pixel PXL on the (i-1)th row.

An auxiliary connection line AUX may be between the fourth source electrode SE4 and the initialization power line IPL. The auxiliary connection line AUX may have one end connected to the fourth source electrode SE4 through a ninth contact hole CH9 and another end connected to an initialization power line IPL on the (i-1)th row through an eighth contact hole CH8 of the pixel PXL on the (i-1)th row. The fourth drain electrode DE4 may have one end connected to the fourth active pattern ACT4 and another end connected to the third drain electrode DE3 of the third transistor T3. Also, the fourth drain electrode DE4 may be connected to the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5. The fifth gate electrode GE5 may be connected to the emission control line Ei, and may be a portion of the emission control line Ei or may be provided in a shape protruding from the emission control line Ei. The fifth active pattern ACT, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5. The fifth source electrode SE5 may have one end connected to the fifth active pattern ACT5 and another end connected to the power line PL through a fifth contact hole CH5. The fifth drain electrode DE5 may have one end connected to the fifth active pattern ACT5 and another end connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6. The sixth gate electrode SE6 may be connected to the emission control line Ei, and may be a portion of the emission control line Ei or may be provided in a shape protruding from the emission control line Ei. The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6.

The sixth source electrode SE6 may have one end connected to the sixth active pattern ACT6 and another end connected to the first drain electrode DE1 of the first transistor T1 and the third source electrode SE3 of the third transistor T3. The sixth drain electrode DE6 may have one end connected to the sixth active pattern ACT6 and another end connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7. The seventh gate electrode GE7 may be connected to the ith scan line Si, and may be a portion of the ith scan line Si or may be provided in a shape protruding from the ith scan line Si. The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 corresponds to a portion overlapping with the seventh gate electrode GE7.

The seventh source electrode SE7 may have one end connected to the seventh active pattern ACT7 and another end connected to the sixth drain electrode DE6 of the sixth transistor T6. The seventh drain electrode DE7 may have one end connected to the seventh active pattern ACT7 and another end connected to the initialization power line IPL. Also, the seventh drain electrode DE7 may be connected to a fourth source electrode SE4 of a fourth transistor T4 of a pixel PXL on an (i+1)th row. The seventh drain electrode DE7 may be connected to the fourth source electrode SE4 of the fourth transistor T4 of the pixel PXL on the (i+1)th row through the auxiliary connection line AUX, the eighth contact hole CH8, and the ninth contact hole CH9.

The storage capacitor Cst may include the lower electrode LE and the upper electrode UE. The lower electrode LE may be the first gate electrode GE1 of the first transistor T1.

The upper electrode UE overlaps with the first gate electrode GE1 and may cover the lower electrode LE when viewed in a plan view. As the overlapping area of the upper electrode UE and the lower electrode LE is widened, the capacitance of the storage capacitor Cst may be increased. The upper electrode UE may extend in the first direction DR1. In an embodiment, a voltage having a level equal to that of the first power source ELVDD may be applied to the upper electrode UE. The upper electrode UE may have a second opening OPN2 in a region including the first contact hole CH1 through which the first gate electrode GE1 and the connection line CNL contact each other.

The light emitting device OLED may include the first electrode AD, the second electrode CD, and the emitting layer EML provided between the first electrode AD and the second electrode CD. The first electrode AD may be provided in an emission region corresponding to each pixel PXL. The first electrode AD may be connected to the seventh source electrode SE7 of the seventh transistor T7 and the sixth drain electrode DE6 of the sixth transistor T6 through a seventh contact hole CH7 and a tenth contact hole CH10.

A bridge pattern BRP may be between the seventh contact hole CH7 and the tenth contact hole CH10. The bridge pattern BRP may connect the sixth drain electrode DE6 and the seventh source electrode SE7 to the first electrode AD. In FIG. 5, a case where the first electrode AD has a rectangular shape is illustrated as an example. In another embodiment, the first electrode AD may have a different shape, e.g., a diamond shape or another shape.

An embodiment of the structure of the display device will be described along a stacking order with reference to FIGS. 5 to 7. An active pattern may be on the substrate SUB and may include the first to seventh active patterns ACT1 to ACT7, the first to seventh source electrodes SE1 to SE7, and the first to seventh drain electrodes DE1 to DE7. The first to seventh active patterns ACT1 to ACT7, the first to seventh source electrodes SE1 to SE7, and the first to seventh drain electrodes DE1 to DE7 may include a semiconductor material.

The first to seventh active patterns ACT1 to ACT7 may include a semiconductor material undoped with impurities. The first to seventh source electrodes SE1 to SE7 and the first to seventh drain electrodes DE1 to DE7 may include a semiconductor material doped with impurities.

A gate insulating layer GI may be over the active pattern. The (i−1)th scan line Si−1, the ith scan line Si, the emission control line Ei, and the first to seventh gate electrodes GE1 to GE7 may be on the gate insulating layer GI. The first gate electrode GE1 may be the lower electrode LE of the storage capacitor Cst. The fourth gate electrode GE4 may be integrally formed with the (i−1)th scan line Si−1. The fifth gate electrode GE5 and the sixth gate electrode GE6 may be integrally formed with the emission control line Ei. The second gate electrode GE2, third gate electrode GE3, and seventh gate electrode GE7 may be integrally formed with the lower ith scan line Si.

A first interlayer insulating layer IL1 may be on the substrate SUB on which the (i−1)th scan line Si−1 and the like are formed. The upper electrode UE of the storage capacitor Cst and the initialization power line IPL may be on the first interlayer insulating layer IL1. The upper electrode UE may cover the lower electrode LE and, along with the lower electrode LE, may corresponding to the storage capacitor Cst, with the first interlayer insulating layer IL1 therebetween.

A second interlayer insulating layer IL2 may be on the substrate SUB on which the upper electrode UE and the initialization power line IPL are disposed. The data line Dj, the power line PL, the connection line CNL, the auxiliary connection line AUX, and the bridge pattern BRP may be on the second interlayer insulating layer IL2.

The data line Dj may be connected to the second source electrode SE2 through the sixth contact hole CH6 passing through the first interlayer insulating layer IL1, the second interlayer insulating layer IL2, and the gate insulating layer GI.

The power line PL may be connected to the upper electrode UE of the storage capacitor Cst through the third and fourth contact holes CH3 and CH4 passing through the second interlayer insulating layer IL2. The power line PL may also be connected to the fifth source electrode SE5 through the fifth contact hole CH5 passing through the first interlayer insulating layer IL1, the second interlayer insulating layer IL2, and the gate insulating layer GI.

The connection line CNL may be connected to the first gate electrode GE1 through the first contact hole CH1 passing through the first interlayer insulating layer IL1 and the second interlayer insulating layer IL2. Also, the connection line CNL may be connected to the third drain electrode DE3 and the fourth drain electrode DE4 through the second contact hole CH2 passing through the gate insulating layer GI, the first interlayer insulating layer IL1, and the second interlayer insulating layer IL2.

The auxiliary connection line AUX may be connected to the initialization power line IPL through the eighth contact hole CH8 passing through the second interlayer insulating layer IL2. Also, the auxiliary connection line AUX may be connected to the fourth source electrode SE4 and the seventh drain electrode DE7 of the pixel PXL on the (i−1)th row through the ninth contact hole CH9 passing through the gate insulating layer GI, first interlayer insulating layer IL1, and second interlayer insulating layer IL2.

The bridge pattern BRP may be a medium connecting the seventh source electrode SE7 to the first electrode AD between the seventh source electrode SE7 and the first electrode AD. The bridge pattern BRP may be connected to the seventh source electrode SE7 and the sixth drain electrode DE6, for example, through the seventh contact hole CH7 passing through the gate insulating layer GI, the first interlayer insulating layer IL1, and the second interlayer insulating layer IL2.

A third interlayer insulating layer IL3 may be on the substrate SUB on which the data line Dj and the like are formed. The organic light emitting device OLED may be on the third interlayer insulating layer IL3 and may include the first electrode AD, the second electrode CD, and the emitting layer EML provided between the first electrode AD and the second electrode CD.

The first electrode AD may be on the third interlayer insulating layer IL3. Since the first electrode AD is connected to the bridge pattern BRP through the tenth contact hole CH10 passing through the third interlayer insulating layer IL3, the first electrode AD may be electrically connected to the sixth drain electrode DE6 and the seventh source electrode SE7.

An encapsulation layer SL may be over the organic light emitting device OLED to prevent oxygen and moisture from penetrating into the organic light emitting device OLED.

Figure 8:
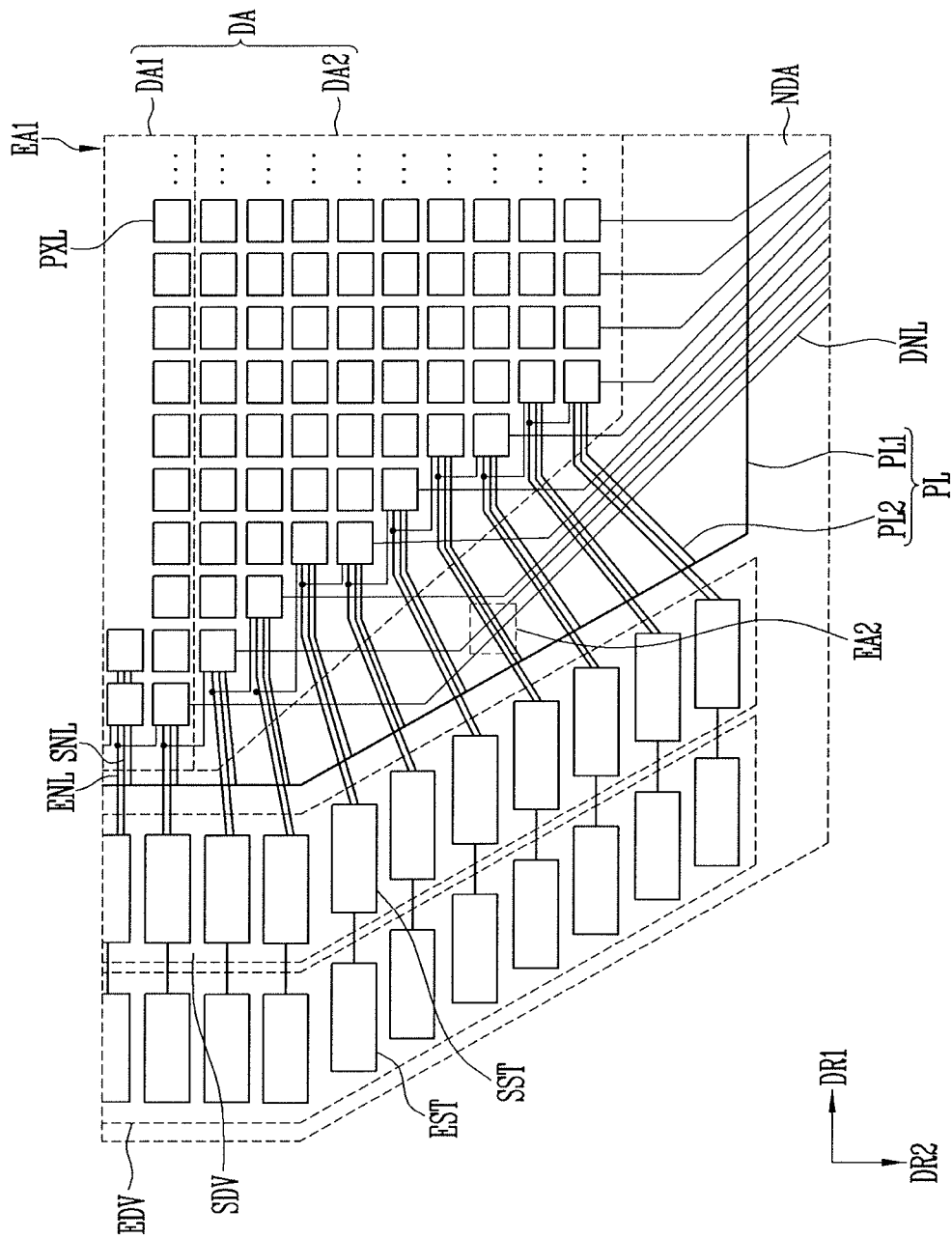
FIG. 8 illustrates an embodiment of region EA1 of FIG. 1.
Figure 9:
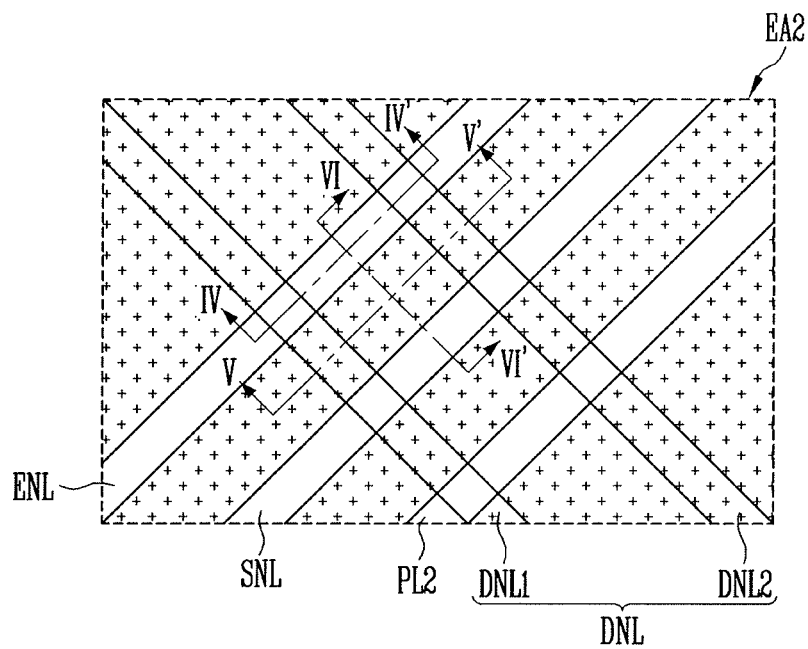
FIG. 9 illustrates an embodiment of region EA2 of FIG. 8.
Figure 10:
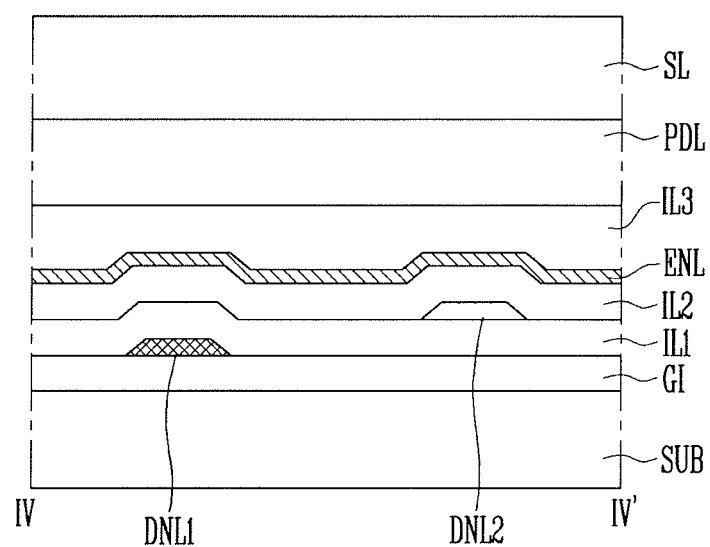
FIG. 10 illustrates a sectional view taken along line IV-IV' of FIG. 9.
Figure 11:
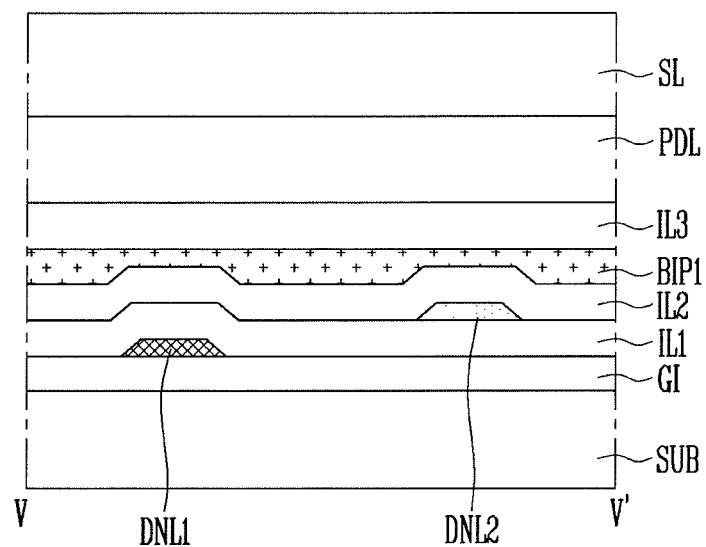
FIG. 11 illustrates a sectional view taken along line V-V' of FIG. 9.
Figure 12:
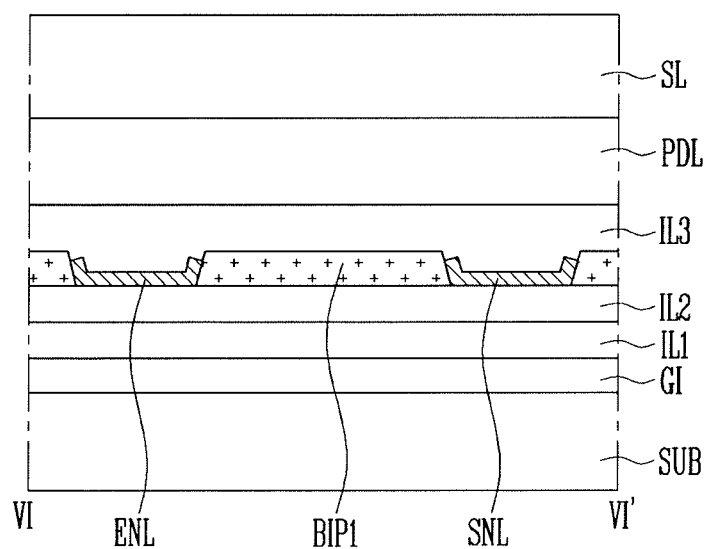
FIG. 12 illustrates a sectional view taken along line VI-VI' of FIG. 9.
Figure 13:
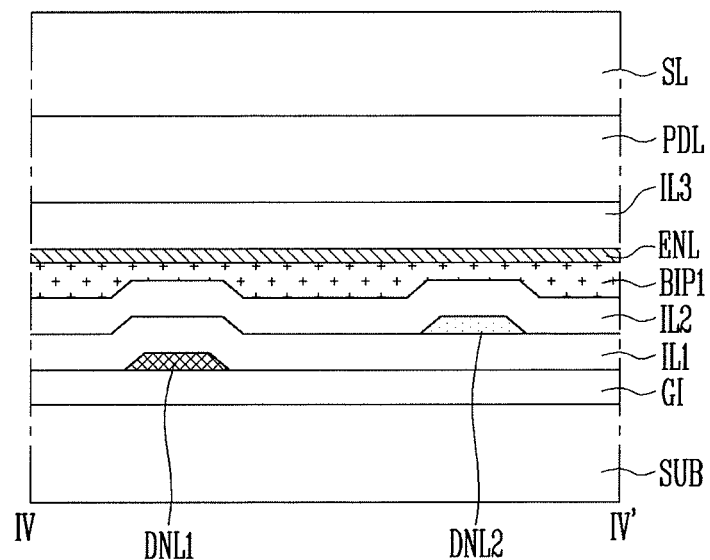
FIG. 13 illustrates another sectional view taken along line IV-IV' of FIG. 9.
Figure 14:
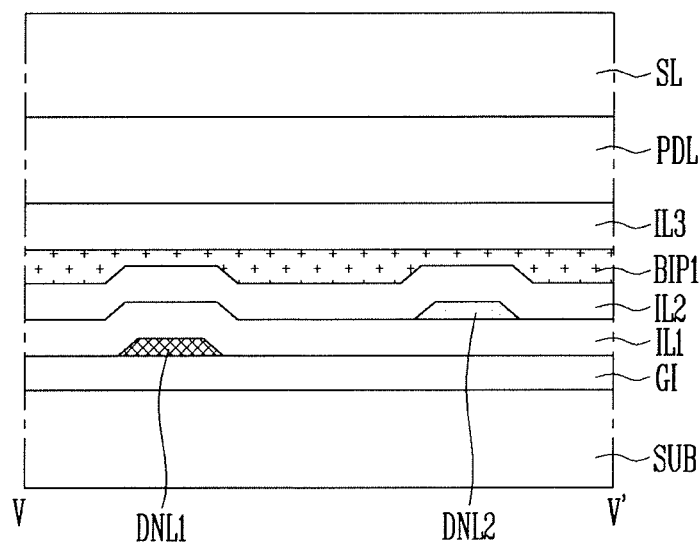
FIG. 14 illustrates another sectional view taken along line V-V' of FIG. 9.
Figure 15:
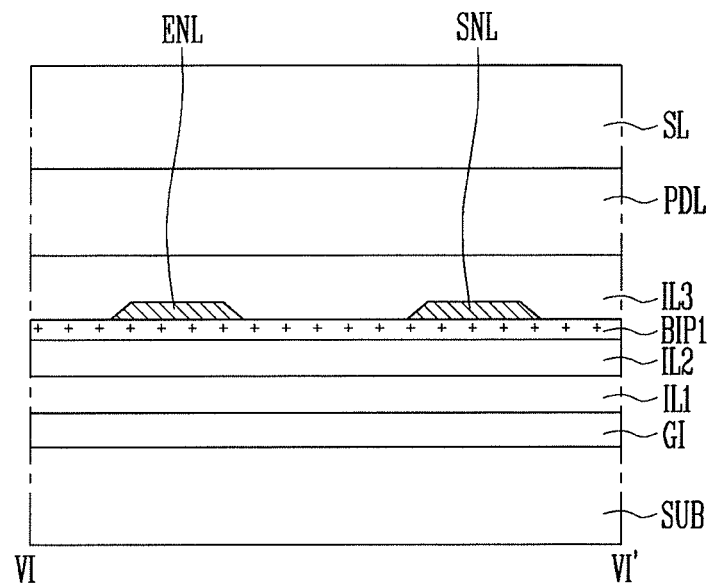
FIG. 15 illustrates another sectional view taken along line VI-VI' of FIG. 9.

FIG. 8 illustrates an enlarged view of region EA1 of FIG. 1 according to an embodiment. FIG. 9 illustrates an enlarged view of region EA2 of FIG. 8 according to an embodiment. FIGS. 10 and 13 are sectional views taken along line IV-IV' of FIG. 9 according to an embodiment. FIGS. 11 and 14 are sectional views taken along line V-V' of FIG. 9 according to an embodiment. FIGS. 12 and 15 are sectional views taken along line VI-VI' of FIG. 9 according to an embodiment.

Referring to FIGS. 1 to 3 and 8 to 15, the substrate SUB may be divided into the display region DA and the non-display region NDA. The pixels PXL may be in the display region DA and arranged in a matrix form. For example, the pixels PXL may constitute a plurality of pixel rows and a plurality of pixel columns in the display region DA. The pixel rows may include a plurality of pixels PXL arranged in the first direction DR1 and may have a shape extending in the first direction DR1. The pixel rows may be arranged in the second direction DR2. The pixel columns may include a plurality of pixels PXL arranged in the second direction DR2 and may have a shape extending in the second direction DR2. The pixel columns may be arranged in the first direction DR1. In an embodiment, the pixels PXL may be arranged in a matrix form as illustrated. The pixels PXL may be arranged in a different form in another embodiment.

The display region DA may include a first display region DA1 and at least one second display region DA2. In an embodiment, the display region DA may include two second display regions DA2. The second display region DA2 may be at different sides of the first display region DA1, which are opposite to each other. In the second direction DR2, the second display regions DA2 may have a shape of which width becomes narrower with increasing distance from the first display region DA1. For example, each of the second display regions DA2 may have a trapezoidal shape having a width that narrows with increasing distance from the first display region DA1. Accordingly, in the second display regions DA2, the number of pixels PXL on each pixel row may reduce with increasing distance from the first display region DA1. In an embodiment, the second display regions DA2 have a trapezoidal shape as illustrated. In one embodiment, the second display regions DA2 may have a different shape, e.g., one in which two inclined sides of the trapezoidal shape are replaced with curves.

For convenience of description, only one side portion of the display region DA is illustrated in FIG. 8. The other side portion of the display region DA may also be formed in the substantially same manner such that the display region DA has a bilaterally symmetrical shape. In one embodiment, the length of each pixel row of the second display regions DA2 may not become shorter at the same rate with increasing distance from the first display region DA1 (or the number of pixels on each pixel row may not reduce at the same rate with increasing distance from the first display region DA1). Also, the number of pixels on each pixel row of the second display regions DA2 may different in different embodiments.

The driving unit may be in the non-display region NDA. The line unit LP of the non-display region NDA may connect the pixels PXL and the driving unit.

The line unit LP of the non-display region NDA allows signals to be provided from the driving unit to each pixel PXL therethrough. The line unit LP may include, for example, scan connection lines SNL connected to the scan lines of the display region DA, emission control connection lines ENL connected to the emission control lines of the display region DA, data connection lines DNL connected to the data lines of the display region DA, and power lines PL for applying the first power source ELVDD (see FIG. 4) to the pixels PXL. According to an embodiment, lines for applying the second power source ELVSS (e.g., see FIG. 4) may be at the periphery of an emission driver.

The data connection lines DNL may connect the data driver and the pixel columns. The data connection lines DNL may generally extent along the second direction DR2. However, at least some of the data connection lines DNL may extend in a direction inclined with respect to the second direction DR2 while having a bent shape. The data connection lines DNL extend to be gathered toward the data driver, and may constitute a data fan-out unit having a shape spread toward the display region DA.

Adjacent data connection lines DNL among the data connection lines DNL may be provided on different layers. For example, one of the adjacent data connection lines DNL (e.g., a first data connection line DNL1) may be between the gate insulating layer GI and the first interlayer insulating layer IL1, for example, as illustrated in FIGS. 5 to 7. Therefore, the first data connection line DNL1 may be formed of the same material through the same process as the first to seventh gate electrodes GE1 to GE7. In addition, the other of the adjacent data connection lines DNL (e.g., a second data connection line) DNL2 may be between the first interlayer insulating layer IL1 and the second interlayer insulating layer IL2, for example, as illustrated in FIGS. 5 to 7. Therefore, the second data connection line DNL2 may be formed of the same material through the same process as the upper electrode UE of the capacitor Cst.

In an embodiment, in order to decrease the width of the non-display region NDA, the distance between the first data connection line DNL1 and the second data connection line DNL2 may be maintained narrowly within a range where the first data connection line DNL1 and the second data connection line DNL2 do not overlap with each other. Therefore, a surface of the second interlayer insulating layer IL2 including an inorganic material may have an uneven shape.

The scan connection lines SNL may allow a scan driver SDV and the pixels PXL to be connected to each other therethrough. The scan driver SDV may be adjacent to the display region DA.

In an embodiment, the scan driver SDV may include a plurality of scan stages SST. Each of the scan stages SST may be connected to one of the scan connection lines SNL. The scan connection lines SNL may allow output terminals of the scan stages SST and scan signal terminals of outermost pixels of the pixel rows to be connected to each other therethrough. The scan stages SST may be driven corresponding to a clock signal and may be implemented, for example, with the substantially same circuit.

The scan driver SDV may have a shape, for example, corresponding to that of the first display region DA1 and the second display region DA2. For example, a region of the scan driver SDV, which corresponds to the second display region DA2, may have an inclined shape. The scan driver SDV may extend along an edge of the display region DA. Therefore, the scan stages SST may be arranged along the edge of the display region DA.

Scan connection lines SNL in the non-display region NDA corresponding to the first display region DA1 may be parallel in the first direction DR1. For example, positions of the output terminals of the scan stages SST and the scan signal input terminals of the outermost pixels of the pixel rows may be equal to each other in the second direction DR2.

Scan connection lines SNL in the non-display region NDA corresponding to the second display region DA2 may be inclined with respect to the first direction DR1. Since the non-display region NDA is provided in a shape surrounding the display region DA, a portion of the non-display region NDA, which corresponds to the second display region DA2, may be inclined or have, for example, a curved shape. Therefore, scan stages SST corresponding to the second display region DA2 may be arranged along the portion of the non-display region NDA, which is inclined or has the curved shape. As a result, at least some scan lines S in the non-display region NDA corresponding to the second display region DA2 may have an angle inclined with respect to the first direction DR1. This is because the positions of the output terminals of the scan stages SST and the scan signal input terminals of the outermost pixels of the pixel rows are different from each other in the second direction DR2.

In an embodiment, a case is illustrated where the positions of the output terminals of the scan stages SST and the scan signal input terminals of the outermost pixels of the pixel rows in the non-display region NDA corresponding to the second display region DA2 are different from each other in the second direction DR2. In one embodiment, the positions of the output terminals of the scan stages SST and the scan signal input terminals of the outermost pixels of the pixel rows may be equal to each other in the second direction DR2.

In an embodiment, the scan connection lines SNL may be between the second interlayer insulating layer IL2 and the third interlayer insulating layer IL3, which are illustrated in FIGS. 7 to 5. Therefore, the scan connection lines SNL may be formed of the same material through the same process as the connection line CNL and the bridge pattern BRP. Although the output terminals of the scan stages SST and the scan signal input terminals of the outermost pixels PXL are not illustrated in FIGS. 8 to 15, in one embodiment, the output terminals of the scan stages and the scan signal input terminals of the outermost pixels PXL may be in a layer different from that of the scan connection lines SNL or may be in the same layer as that of the scan connection lines SNL.

The emission control connection lines ENL may allow an emission driver EDV of the driving unit and the pixels PXL to be connected to each other therethrough. The emission driver EDV may be adjacent to the scan driver SDV. The scan driver SDV may be between the emission driver EDV and the display region DA. Accordingly, the emission driver EDV may be at a more outer location than the scan driver SDV.

In an embodiment, the emission driver EDV may include a plurality of emission stages EST. The emission control connection lines ENL may allow output terminals of the emission stages EST and emission signal input terminals of the outermost pixels of the pixel rows to be connected to each other therethrough, and the emission stages EST may be driven corresponding to a clock signal. The emission stages EST may be implemented, for example, with the substantially same circuit.

The emission driver EDV may have a shape corresponding to that of the first display region DA1 and the second display region DA2. For example, a region of the emission driver EDV, which corresponds to the second display region DA2, may be inclined or have a curved shape.

The emission stages EST may correspond to the pixel rows in the display region DA, respectively. Each of the emission stages EST may supply an emission control signal to pixels PXL on a corresponding pixel row.

Emission control connection lines ENL in the non-display region NDA corresponding to the first display region DA1 may be parallel in the first direction DR1. For example, the positions of the output terminals of the emission stages EST and the emission signal input terminals of the outermost pixels of the pixel rows may be equal to each other in the second direction DR2.

Emission control connection lines ENL in the non-display region NDA corresponding to the second display region DA2 may be inclined with respect to the first direction DR1. One end portions of emission control lines E in the non-display region NDA may be connected to the pixels PXL, respectively, and the other end portions of the emission control lines E may be connected to the emission stages EST, respectively.

Since the region of the emission driver EDV, which corresponds to the second display region DA2, is inclined or has a curved shape, emission stages EST corresponding to the second display region DA2 may also be arranged along the portion of the non-display region NDA, which is inclined or has the curved shape. As a result, at least some of the emission control connection lines ENL in the non-display region NDA corresponding to the second display region DA2 may have an angle inclined with respect to the first direction DR1. This is because the positions of the output terminals of the emission stages EST and the emission signal input terminals of the outermost pixels of the pixel rows are different from each other in the second direction DR2.

In an embodiment, a case is illustrated where the positions of the output terminals of the emission stages EST and the emission signal input terminals of the outermost pixels of the pixel rows in the non-display region NDA corresponding to the second display region DA2 are different from each other in the second direction DR2. In one embodiment, the positions of the output terminals of the emission stages EST and the emission signal input terminals of the outermost pixels of the pixel rows may be equal to each other in the second direction DR2.

In an embodiment, the emission control connection lines ENL may be between the second interlayer insulating layer IL2 and the third interlayer insulating layer IL3, for example, as illustrated in FIGS. 7 to 5. Therefore, the emission control connection lines ENL may be formed, for example, of the same material through the same process as the connection line CNL and the bridge pattern BRP. Although the output terminals of the emission stages EST and the emission control signal input terminals of the outermost pixels PXL are not illustrated in FIGS. 8 to 15, the output terminals of the emission stages EST and the emission control signal input terminals of the outermost pixels PXL may be in a layer different from that of the emission control connection lines ENL or may be in the same layer as that of the emission control connection lines ENL The power lines PL may be connected to the pixels PXL in order to apply the first power source ELVDD to the pixels PXL. In an embodiment, the power lines PL may include a first power line PL1 extending from the non-display region NDA and power connection lines PL2 branching off from the first power line PL1 to be connected to the pixels PXL. At least the power connection lines PL2 among the power lines PL may be between the second interlayer insulating layer IL2 and the third interlayer insulating layer IL3, for example, as illustrated in FIGS. 5 to 7. Therefore, the power connection lines PL2 may be formed, for example, of the same material through the same process as the connection line CNL and the bridge pattern BRP.

In an embodiment, the first power line PL1 may be on the same layer as that of the power connection lines PL2. For example, the first power line PL1 may be formed of the same material through the same process as the power connection lines PL2. In this case, the output terminals of the emission stages EST and the emission control signal input terminals of the outermost pixels PXL may be on a layer different from that of the emission control connection lines ENL. In one embodiment, the first power line PL1 may be on the same layer as that of the power connection lines PL2. In one embodiment, the first power line PL1 may be on a layer different from that of the power connection lines PL2.

In an embodiment, in the non-display region NDA, the region between the scan driver SDV and the pixels PXL may be a line connection region in which the scan connection lines SNL, the emission control connection lines ENL, and the power connection lines PL2 are provided. For example, the data connection lines DNL, the scan connection lines SNL, the emission control connection lines ENL, and the power connection lines PL2 may be in the line connection region. Also, in the line connection region, the scan connection lines SNL may allow the scan driver SDV and the pixels PXL to be connected to each other therethrough, the emission control connection lines ENL may allow the emission driver EDV and the pixels PXL to be connected to each other therethrough, and the power connection lines PL2 may allow the first power line PL1 and the pixels PXL to be connected to each other therethrough.

In the line connection region, the scan connection lines SNL, the emission control connection lines ENL, and the power connection lines PL2 may intersect the data connection lines DNL. Therefore, the scan connection lines SNL, the emission control connection lines ENL, and the power connection lines PL2 may have an uneven shape corresponding to that of the second interlayer insulating layer IL2.

In addition, among the scan connection lines SNL, the emission control connection lines ENL, and the power connection lines PL2, a scan connection line SNL, an emission control connection line ENL, and a power connection line PL2, which are connected to one pixel row, are parallel to one another.

Referring to FIGS. 9 to 12, first insulating patterns BIP1 may be on the second interlayer insulating layer IL2 between adjacent lines among the scan connection lines SNL, the emission control connection lines ENL, and the power connection lines PL2. At least portion of the first insulating patterns BIP1 may be between the data connection lines DNL and the scan connection lines SNL. For example, at least a portion of the first insulating patterns BIP1 may overlap with the data connection lines DNL and the scan connection lines SNL The first insulating patterns BIP1 may be formed, for example, of the same material through the same process as the bent insulating layer (e.g., see BIL of FIG. 3). For example, the first insulating patterns BIP1 may formed in a process between a process of forming the second interlayer insulating layer IL2 and a process of forming the scan connection lines SNL, the emission control connection lines ENL, and the power connection lines PL2.

In addition, in FIGS. 9 and 13 to 15, in the non-display region NDA, the first insulating patterns BIP1 may have a shape covering the entire second interlayer insulating layer IL2. For example, the first insulating patterns BIP1 may be connected to each other to constitute an insulating pattern layer. Also, the first insulating patterns BIP1 may have a shape in which the bent insulating layer BIL extends. Therefore, the scan connection lines SNL, the emission control connection lines ENL, and the power connection lines PL2 may be on the first insulating patterns BIP1.

Since the first insulating patterns BIP1 include an organic material, the uneven pattern of the second interlayer insulating layer IL2 may be planarized. For example, surfaces of the first insulating patterns BIP1 may have a planarized shape. Thus, in the process of forming the scan connection lines SNL, the emission control connection lines ENL, and the power connection lines PL2, the first insulating patterns BIP1 may prevent a conductive material from remaining at a concave portion of the uneven pattern of the second interlayer insulating layer IL2. Accordingly, it is possible to prevent a short circuit from occurring between adjacent lines among the scan connection lines SNL, the emission control connection lines ENL, and the power connection lines PL2.

When the display device does not include the first insulating patterns BIP1, a conductive material in the scan connection lines SNL, the emission control connection lines ENL, and the power connection lines PL2 may remain at a concave portion of the second interlayer insulating layer IL2 in the process of forming the scan connection lines SNL, the emission control connection lines ENL, and the power connection lines PL2. When the conductive material remains at the concave portion of the second interlayer insulating layer IL2, a short circuit may be caused between adjacent lines among the scan connection lines SNL, the emission control connection lines ENL, and the power connection lines PL2.

Figure 16:
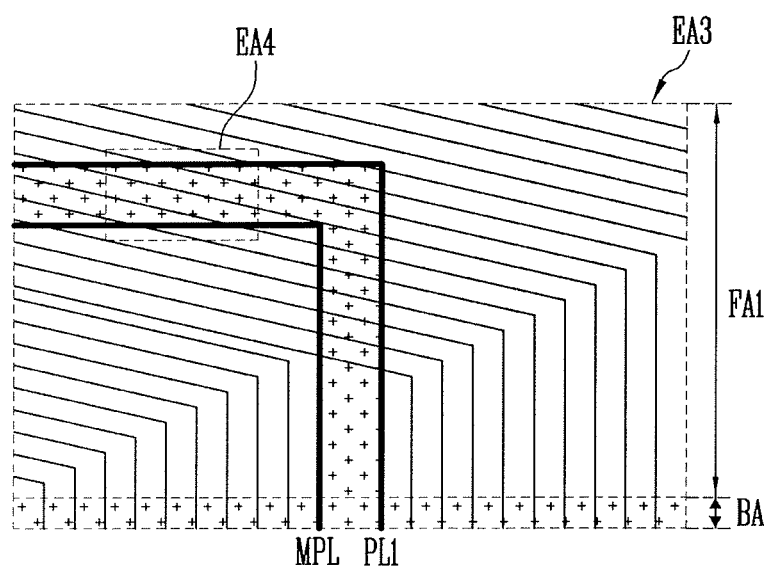
FIG. 16 illustrates an embodiment of region EA3 of FIG. 1.
Figure 17:
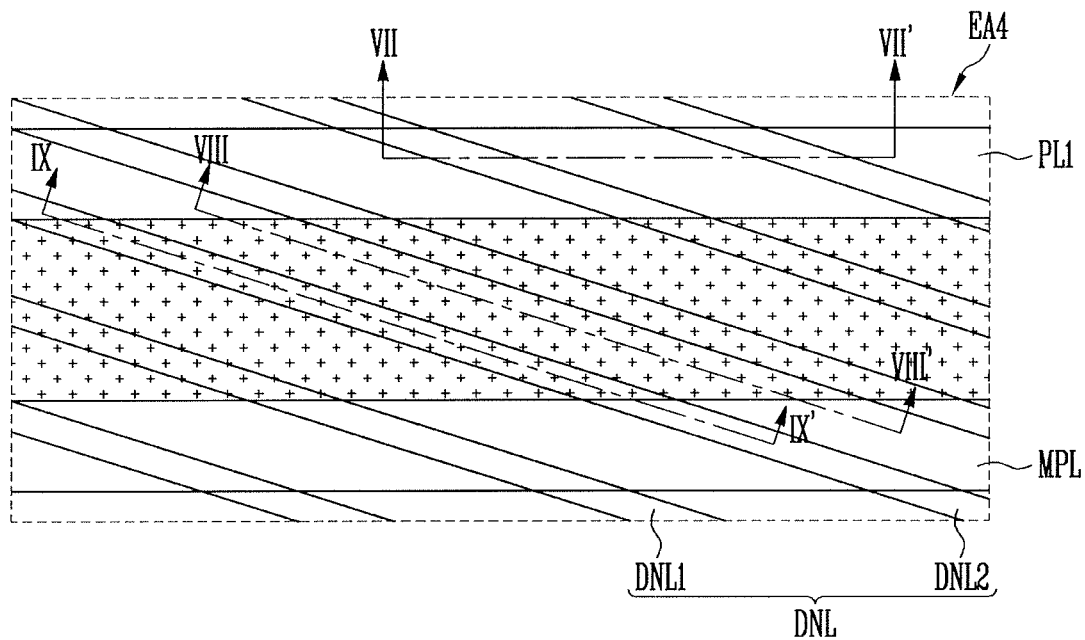
FIG. 17 illustrates an embodiment of region EA4 of FIG. 16.
Figure 18:
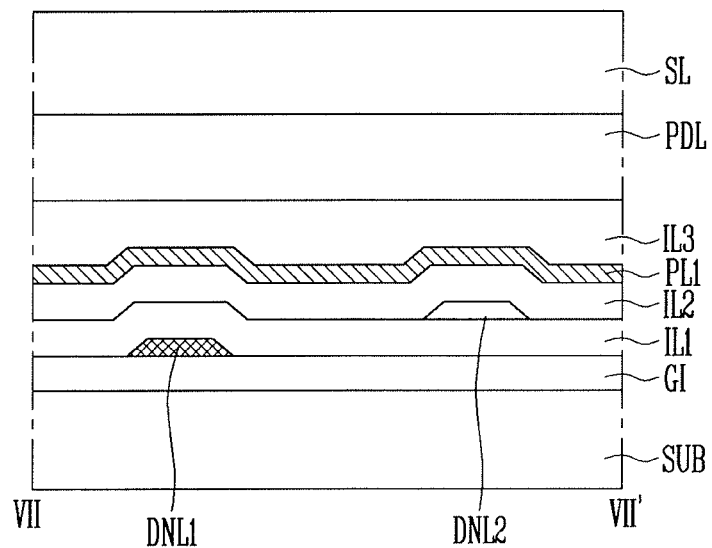
FIG. 18 illustrates a sectional view taken along line VII-VII' of FIG. 17.
Figure 19:
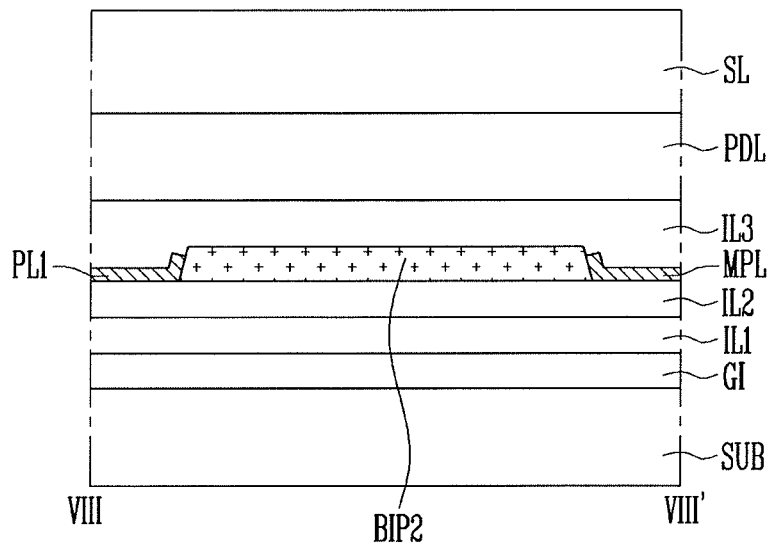
FIG. 19 illustrates a sectional view taken along line VIII-VIII' of FIG. 17.
Figure 20:
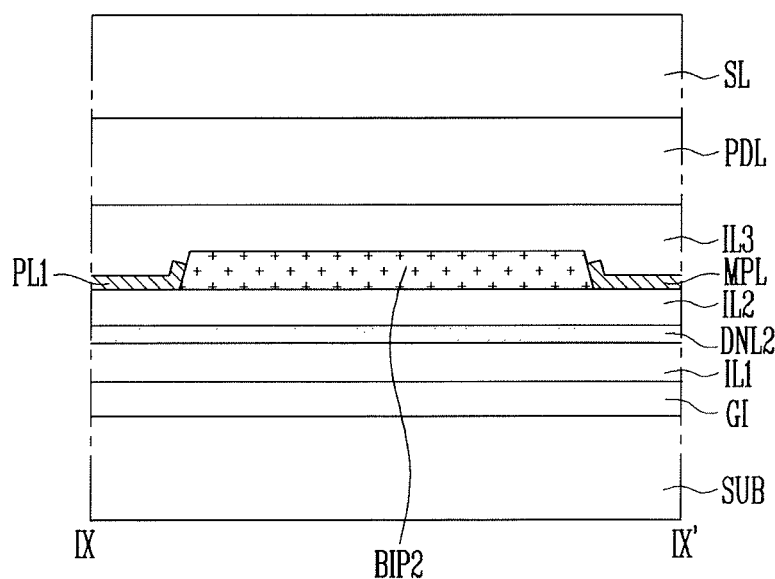
FIG. 20 illustrates a sectional view taken along line IX-IX' of FIG. 17.
Figure 21:
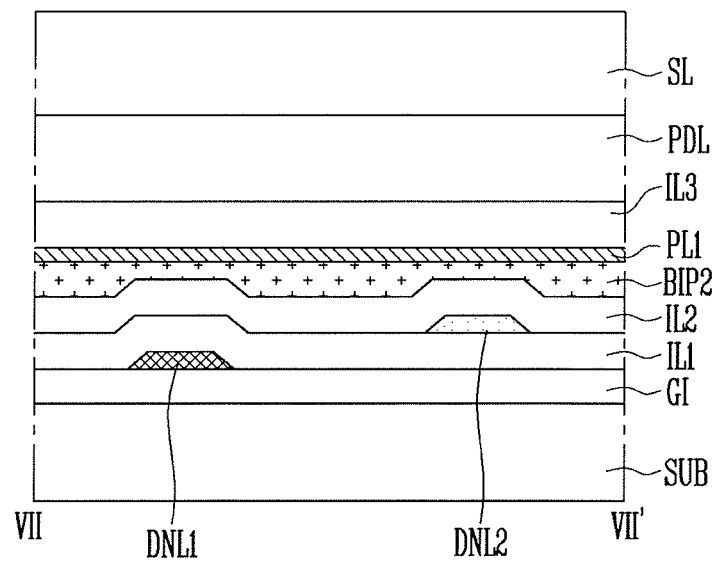
FIG. 21 illustrates another sectional view taken along line VII-VII' of FIG. 17.
Figure 22:
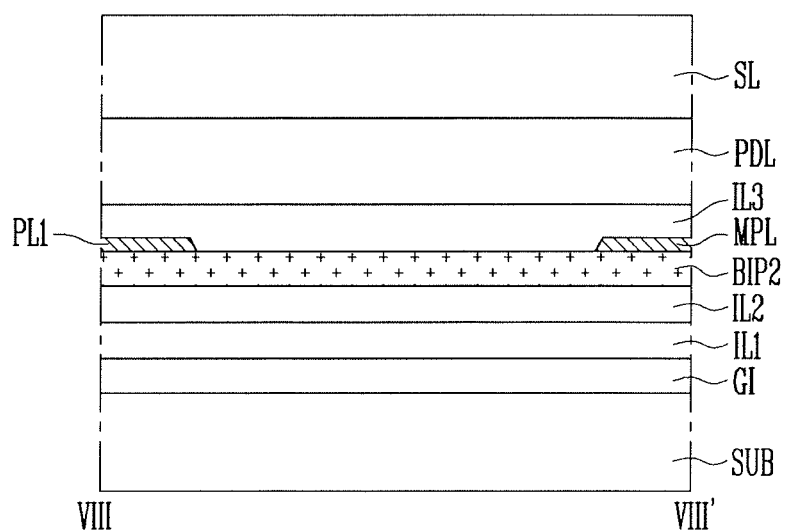
FIG. 22 illustrates another sectional view taken along line VIII-VIII' of FIG. 17.
Figure 23:
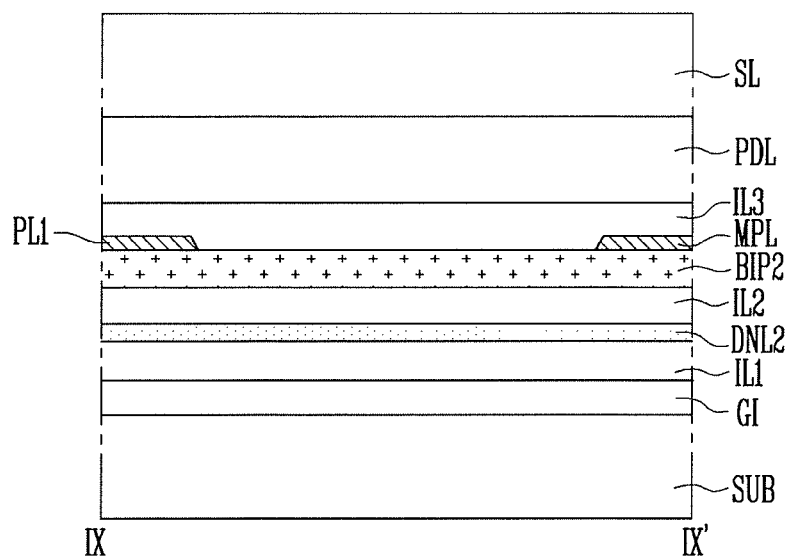
FIG. 23 illustrates another sectional view taken along line IX-IX' of FIG. 17.

FIG. 16 illustrates an enlarged view of region EA3 of FIG. 1 according to an embodiment. FIG. 17 illustrates an enlarged view of region EA4 of FIG. 16 according to an embodiment. FIGS. 18 and 21 illustrate sectional views taken along line VII-VII' of FIG. 17 according to an embodiment. FIGS. 19 and 22 illustrate sectional views taken along line VIII-VIII' of FIG. 17 according to an embodiment. FIGS. 20 and 23 illustrate sectional views taken along line IX-IX' of FIG. 17 according to an embodiment.

Referring to FIGS. 1 to 3 and 16 to 23, the substrate SUB may be divided into the display region DA and the non-display region NDA. The driving unit may be in the non-display region NDA. The line unit LP of the non-display region NDA may allow the pixels PXL of the display region DA and the driving unit to be connected to each other therethrough. In addition, the non-display region NDA may further include the additional region ADA protruding from a portion thereof.

The substrate SUB may be divided into the bent region BA and the flat region FA. The bent region BA has at least a portion having flexibility and is bent in one direction. The flat region FA that is at at least one side of the bent region BA and is flat without being folded. The flat region FA may include the first flat region FA1 and the second flat region FA2, which are spaced apart from each other, with the bent region BA therebetween. The first flat region FA1 may be a portion of the display region DA, the non-display region NDA, and the additional region ADA. The bent region BA may be spaced apart from the display region DA, e.g., the bent region BA may be in the additional region ADA.

The driving unit may include the data driver, the scan driver, and the emission driver. The line unit LP of the non-display region NDA allows signals to be provided from the driving unit to each pixel PXL therethrough, and may include the scan connection lines connected to the scan lines of the display region DA, the emission control connection lines connected to the emission control lines of the display region DA, the data connection lines DNL connected to the data lines of the display region DA, the power lines PL for applying the first power source to the pixels PXL, and second power line MPL for applying the second power source to the pixels PXL.

The data connection lines DNL may allow the data driver and the pixel columns to be connected to each other therethrough. At least some of the data connection lines DNL may extend in a direction inclined with respect to the second direction DR2. For example, one sides of the data connection lines DNL may extend to be gathered toward the data driver, and may constitute a data fan-out unit having a shape spread toward the display region DA. For example, the data fan-out unit may be at a portion of the first flat region FA1 which is adjacent to the bent region BA.

In the data fan-out unit, adjacent data connection lines among the data connection lines DNL may be on different layers. For example, one of the adjacent data connection lines DNL (e.g., the first data connection line DNL1) may be between the gate insulating layer GI and the first interlayer insulating layer IL1, for example, as illustrated in FIGS. 5 to 7. Therefore, the first data connection line DNL1 may be formed, for example, of the same material through the same process as the first to seventh gate electrodes GE1 to GE7. The other of the adjacent data connection lines DNL (e.g., the second data connection line DNL2) may be between the first interlayer insulating layer IL1 and the second interlayer insulating layer IL2, for example, as illustrated in FIGS. 5 to 7. Therefore, the second data connection line DNL2 may be formed, for example, of the same material through the same process as the upper electrode UE of the capacitor Cst.

The surface of the second interlayer insulating layer IL2 over the second data connection line DNL2 may have an uneven shape formed by the first data connection line DNL1 and the second data connection line DNL2.

The first power line PL1 may apply the first power source ELVDD to the pixels PXL. The second power line MPL may apply the second power source ELVSS to the pixels PXL.

In the data fan-out unit, the first power line PL1 and the second power line MPL may be between the second interlayer insulating layer IL2 and the second interlayer insulating layer IL3, for example, as illustrated in FIGS. 5 to 7. Therefore, the first power line PL1 and the second power line MPL may be formed, for example, of the same material through the same process as the connection line CNL and the bridge pattern BRP.

Referring to FIGS. 17 to 20, in the data fan-out unit, a second insulating pattern BIP2 may be on the second interlayer insulating layer IL2 between the first power line PL1 and the second power line MPL. At least a portion of the second insulating pattern BIP2 may be between the data connection lines DNL and the first power line PL1 and between the data connection lines DNL and the second power line MPL. For example, at least a portion of the second insulating pattern MPL may overlap with the data connection lines DNL and the first power line PL1, and may overlap with the data connection lines DNL and the second power line MPL.

The second insulating pattern BIP2 may be formed, for example, of the same material through the same process as that of the bent insulating layer BIL. In one embodiment, the second insulating pattern BIP2 may be formed by a process between the process of forming the second interlayer insulating layer IL2 and a process of forming the first power line PL1 and the second power line MPL.

Referring to FIGS. 17 and 21 to 23, in the data fan-out unit, the second insulating pattern BIP2 on the second interlayer insulating layer IL2 between the first power line PL1 and the second power line MPL may have a shape in which the bent insulating layer BIL extends. Also, the second insulating pattern BIP2 may cover the entire fan-out unit.

Since the second insulating pattern BIP2 includes an organic material, the uneven pattern of the second interlayer insulating layer IL2 may be planarized. For example, a surface of the second insulating pattern BIP2 may have a planarized shape. Thus, in the process of forming the first power line PL1 and the second power line MPL, the second insulating pattern BIP2 may prevent a conductive material from remaining at a concave portion of the uneven pattern of the second interlayer insulating layer IL2. Accordingly, it is possible to prevent a short circuit from occurring between the first power line PL1 and the second power line MPL.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The drivers and other signal generating, signal providing, and signal processing features of the embodiments disclosed herein may be implemented in non-transitory logic which, for example, may include hardware, software, or both. When implemented at least partially in hardware, the drivers and other signal generating, signal providing, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers and other signal generating, signal providing, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

According to one or more embodiments, the occurrence of a failure such as a disconnection or a short circuit may be reduced or minimized in a manufacturing process of the display device. Accordingly, a high-quality display device may be provided.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a substrate including a display region to display an image, a non-display region on at least one side of the display region, an additional region protruding from a portion of the non-display region, and a bent region in the additional region;
a plurality of pixels in the display region;
a first insulating layer disposed on the substrate;
first lines provided between the substrate and the first insulating layer in the non-display region, the first lines extending along the non-display region;
second lines in the non-display region on the first insulating layer in the non-display region, the second lines being alternately disposed with the first lines;
a second insulating layer in the non-display region over the second lines and having an upper surface unevenness formed by the first and second lines and including an opening that exposes the substrate of the bent region therethrough;
a bent insulating layer filling in the opening and including an organic material;
third lines in the non-display region over the second insulating layer and intersecting the first lines and the second lines in a plan view; and
first insulating patterns disposed on the second insulating layer and between at least adjacent third lines in the plan view, the first insulating patterns to planarize the upper surface unevenness,
wherein the bent insulating layer and the first insulating patterns are provided on a same layer.

2. The display device of claim 1, wherein the first insulating patterns include a same material as the bent insulating layer.

3. The display device of claim 2, wherein at least a portion of the first insulating patterns are between the first lines and the third lines and between the second lines and the third lines.

4. The display device of claim 3, further comprising:
data connection lines in the non-display region to apply data signals to the pixels;
scan connection lines in the non-display region to apply scan signals to the pixels;
power connection lines in the non-display region to apply a power source to the pixels; and
emission control connection lines in the non-display region to apply emission control signals to the pixels,
wherein, in the plan view, the scan connection lines, the power connection lines, and the emission control connection lines intersect the data connection lines.

5. The display device of claim 4, wherein:
the data connection lines include first data connection lines disposed on the first insulating layer and second data connection lines disposed between the first insulating layer and the second insulating layer,
the first lines include the first data connection lines, and the second lines include the second data connection lines.

6. The display device of claim 5, wherein:
the third lines include the scan connection lines, the power connection lines, and the emission control connection lines, and
the scan connection lines, the power connection lines, and the emission control connection lines are disposed to be spaced from each other, in the plan view.

7. The display device of claim 6, wherein, in the plan view, the first insulating patterns are between adjacent lines among the scan connection lines, the power connection lines, and the emission control connection lines.

8. The display device of claim 7, wherein the first insulating patterns are connected to each other to form a first insulating pattern layer.

9. The display device of claim 8, wherein the scan connection lines, the power connection lines, and the emission control connection lines are disposed on the first insulating pattern layer.

10. The display device of claim 9, further comprising:
a first power line extending from the additional region to the non-display region and connected to the power connection lines to supply a first power source to the pixels; and
a second power line extending from the additional region to the non-display region, the second power line to supply a second power source to the pixels,
wherein the data connection lines extend to the additional region to intersect the first power line and the second power line.

11. The display device of claim 10, wherein:
a voltage of the first power source is different from a voltage of the second power source, and the first power line and the second power line are on the second insulating layer.

12. The display device of claim 11, further comprising:
a second insulating pattern between the first power line and the second power line in the plan view, the second insulating pattern to planarize the upper surface unevenness.

13. The display device of claim 12, wherein at least a portion of the second insulating pattern is between the data connection lines and the first power line and between the data connection lines and the second power line.

14. The display device of claim 13, wherein the second insulating pattern includes a same material as that of the first insulating patterns.

15. The display device of claim 4, wherein the bent insulating layer filling in the opening is between the substrate and a portion of the data connection lines.

16. The display device of claim 1, wherein the first insulating patterns are disposed only in the non-display region on the second insulating layer.

* * * * *